United States Patent [19]
Bron

[11] Patent Number: 6,163,874
[45] Date of Patent: Dec. 19, 2000

[54] APPARATUS AND METHOD FOR DOUBLING SPEED OF RANDOM EVENTS GENERATOR

[75] Inventor: Ernest Armand Bron, Mountain View, Calif.

[73] Assignee: National Semiconductor Corporation, Santa Clara, Calif.

[21] Appl. No.: 08/935,879

[22] Filed: Sep. 23, 1997

[51] Int. Cl.[7] .................................................. G06F 7/00
[52] U.S. Cl. ........................................................ 716/4
[58] Field of Search .................................. 364/488, 489, 364/490, 491, 578; 714/814

[56] References Cited

U.S. PATENT DOCUMENTS

| | | | |
|---|---|---|---|
| 4,385,349 | 5/1983 | Ashford | 700/79 |
| 5,313,622 | 5/1994 | Truchard | 714/814 |
| 5,515,383 | 5/1996 | Katoozi | 714/732 |
| 5,568,407 | 10/1996 | Hass | 364/579 |
| 5,691,917 | 11/1997 | Harrison | 364/579 |

*Primary Examiner*—Paul R. Lintz
*Assistant Examiner*—Thuan Do
*Attorney, Agent, or Firm*—Limbach & Limbach LLP

[57] ABSTRACT

An apparatus and method for generating a sequence of random, repeatable events for testing a cloned device against the device from which it is derived. The invention includes elements used to double the speed at which the event generator produces the events. This allows the event generator to be used in the testing of devices, such as CPUs, which operate at relatively high clock rates.

10 Claims, 28 Drawing Sheets

XC4013PG223

| Pin | Signal | Pin | Signal |
|---|---|---|---|
| SGCK4-DOUT-IO | T4 | | IPA4 |
| SGCK3-IO | T16 | | ISENBWR1* |
| SGCK2-IO | B16 | | IA12 |
| SGCK1-A15-IO | B2 | | SDDATA3WR* |
| PGCK4-A1-IO | U1 | | FIXA11 |
| PGCK3-IO | U16 | | SELA4 |
| PGCK2-IO | B17 | | XTL-CLK1 |
| PGCK1-A16-IO | C3 | | XTLCLK |
| IO-ERR-INIT | J18 | | IPA10 |
| IO-LDC | E17 | | IPA9 |
| IO-HDC | E16 | | IPA8 |
| IO-TMS | B7 | | IPA7 |
| IO-TCK | B4 | | IPA6 |
| IO-TDI | A2 | | IPA5 |
| IO-CSO | V12 | | SALA5 |
| IO-RCLK-BUSY-RDY | V2 | | IPA11 |
| IO-A0-WS | T3 | | DILOWR0* |
| IO-D1 | V3 | | ISENBWR0* |
| IO-D2 | V7 | | FIXA5 |
| IO-D3 | T9 | | SELB11 |
| IO-D4 | U10 | | DD15 |
| IO-D5 | U12 | | FIXB4 |
| IO-D6 | V17 | | DA1 |
| IO-D7 | T15 | | ISENBRD1* |
| IO-A2-CS1 | T2 | | FIXB1 |
| IO-A3 | N3 | | SELB2 |
| IO-A4 | M2 | | ID14 |
| IO-A5 | M1 | | ID11 |
| IO-A6 | K2 | | ID6 |
| IO-A7 | K3 | | ID10 |
| IO-A17 | C4 | | EVTYPERD0* |
| IO-A14 | C2 | | IIGOFFWR |
| IO-A13 | D2 | | SDDATA2WR* |
| IO-A12 | F3 | | EVTYPERD1* |
| IO-A11 | G2 | | TOW* |
| IO-A10 | G1 | | DIL1RD0 |
| IO-A9 | J2 | | ID1 |
| IO-A8 | J3 | | ID0 |

Bottom pins:

| Signal | Pin |
|---|---|
| FIXB0 | R7 |
| FIXA7 | R6 |
| FIXA1 | R5 |
| SELA2 | V5 |
| FIXB7 | V4 |
| ISAEB* | U5 |
| SELA10 | T6 |
| FIXB3 | U4 |
| FIXB2 | T5 |
| FIXA0 | P3 |
| FIXA2 | R2 |
| FIXB9 | P4 |
| SELB10 | N4 |
| FIXB8 | P2 |
| FIXA9 | T1 |
| ID2 | R1 |
| ID3 | N2 |
| ID7 | P1 |
| ID5 | N1 |
| ID12 | M4 |
| ID9 | L4 |
| ID15 | L3 |
| ID13 | L2 |
| ID4 | L1 |
| ID8 | K1 |
| SELA3 | U9 | corresponding IO pins: IO127–IO151, IO-RS

FIG. 11B

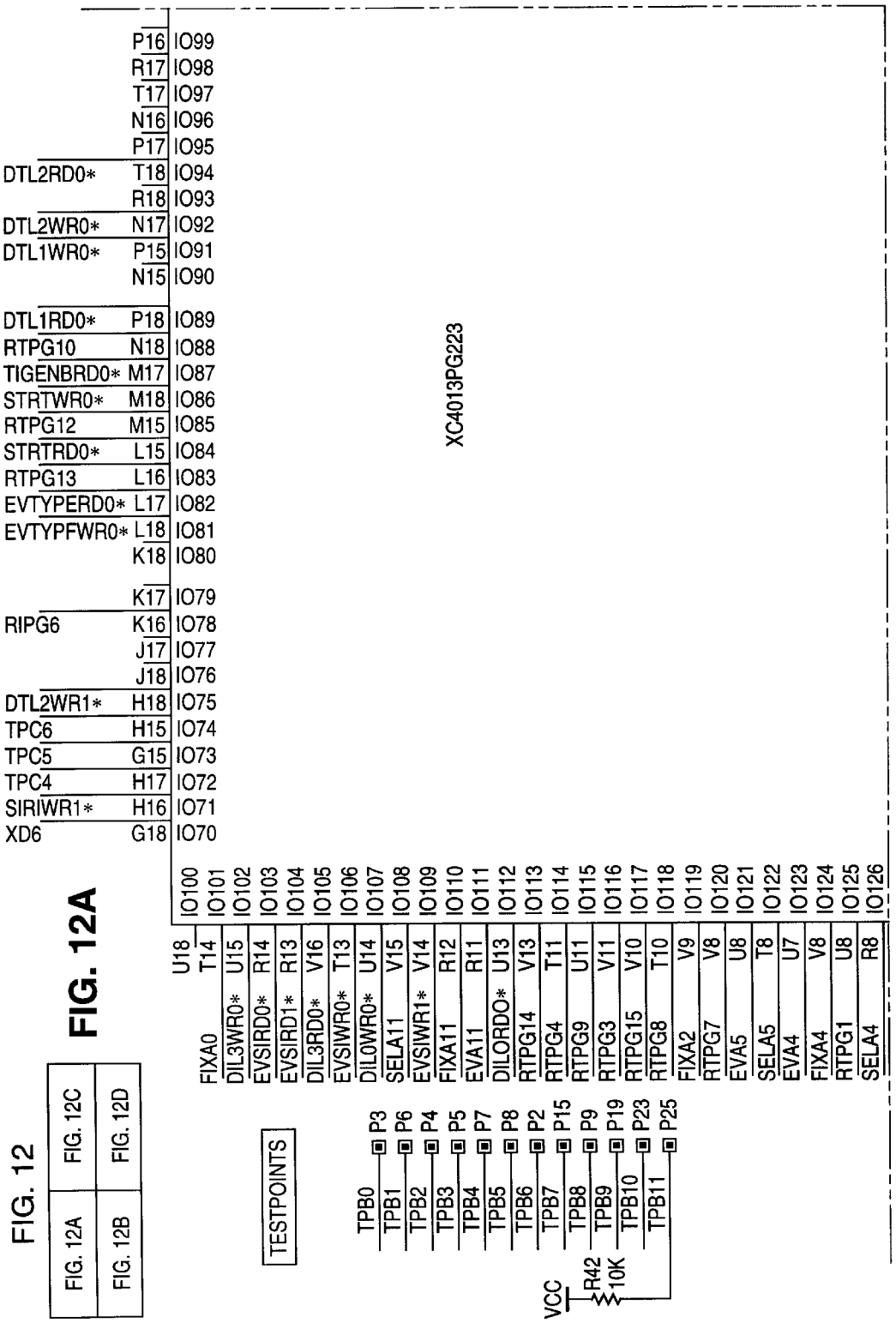

| | | |
|---|---|---|
| SGCK4-DOUT-IO | T4 | |
| SGCK3-IO | T16 | |
| SGCK2-IO | B16 | EVB10 |
| SGCK1-A15-IO | B2 | ENREG* |
| PGCK4-A1-IO | U1 | FIXA9 |
| PGCK3-IO | U16 | SELA0 |
| PGCK2-IO | B17 | CLKTN2 |
| PGCK1-A16-IO | C3 | XTL-CLK1 |
| IO-ERR-INIT | J18 | IPB11 |
| IO-LDC | E17 | IPB10 |
| IO-HDC | E16 | IPB9 |
| IO-TMS | B7 | IPB8 |
| IO-TCK | B4 | IPB7 |
| IO-TDI | A2 | IPB6 |
| IO-CSO | V12 | RTPG5 |
| IO-RCLK-BUSY-RDY | V2 | |
| IO-A0-WS | T3 | EVA9 |
| IO-D1 | V3 | FIXA10 |
| IO-D2 | V7 | FIXA5 |
| IO-D3 | T9 | SELA2 |
| IO-D4 | U10 | RIPG11 |
| IO-D5 | U12 | RTPG2 |
| IO-D6 | V17 | |
| IO-D7 | T15 | EVA0 |
| IO-A2-CS1 | T2 | |
| IO-A3 | N3 | TIGENBWR0* |
| IO-A4 | M2 | EVB1 |
| IO-A5 | M1 | EVA1 |
| IO-A6 | K2 | FIXB3 |
| IO-A7 | K3 | EVB5 |
| IO-A17 | C4 | |
| IO-A14 | C2 | |
| IO-A13 | D2 | DIL1RD1* |
| IO-A12 | F3 | TIGENBWR1* |
| IO-A11 | G2 | DIL2RD1* |
| IO-A10 | G1 | EVTYPERD1* |
| IO-A9 | J2 | SELB4 |
| IO-A8 | J3 | FIXB5 |

XC4013PG223

| Signal | Pin | Signal |
|---|---|---|
| FIXA3 | R7 | IO127 |
| EVA3 | R6 | IO128 |
| SELA3 | R5 | IO129 |
| FIXA6 | V5 | IO130 |
| EVA6 | V4 | IO131 |
| SELA6 | U5 | IO132 |
| SELA10 | T6 | IO133 |
| EVA10 | U4 | IO134 |
| SELA9 | T5 | IO135 |
| TSENBRD0* | P3 | IO136 |
| TSENBRD1* | R2 | IO137 |
| SELA8 | P4 | IO138 |
| FIXA8 | N4 | IO139 |
| EVA8 | P2 | IO140 |
| EVB3 | T1 | IO141 |
| SELA7 | R1 | IO142 |
| EVA7 | N2 | IO143 |
| FIXA7 | P1 | IO144 |
| RTPG0 | N1 | IO145 |
| SELB3 | M4 | IO146 |
| FIXB1 | L4 | IO147 |
| SELB1 | L3 | IO148 |
| FIXA1 | L2 | IO149 |
| SELA1 | L1 | IO150 |
| TSLO1 | K1 | IO151 |
| EVA2 | U9 | IO-RS |

FIG. 12B

| | | |
|---|---|---|
| IO28 | D8 | TPA4 |
| IO29 | C8 | TPA5 |
| IO30 | A7 | TPA6 |
| IO31 | B8 | XD11 |
| IO32 | A8 | XD8 |
| IO33 | B9 | XD14 |
| IO34 | C9 | TPA7 |
| IO35 | C10 | TPA8 |
| IO36 | B10 | TPA9 |
| IO37 | A9 | XD9 |
| IO38 | A10 | XD7 |
| IO39 | A11 | XD2 |
| IO40 | C11 | XD4 |
| IO41 | D11 | XD12 |
| IO42 | D12 | TPA10 |
| IO43 | B11 | XD13 |
| IO44 | A12 | TPA11 |
| IO45 | B12 | TPC0 |
| IO46 | A13 | EVB6 |
| IO47 | D13 | SELB6 |
| IO48 | D14 | FIXB6 |
| IO49 | B13 | XD1 |
| IO50 | A14 | TPC1 |
| IO51 | A15 | XD5 |
| IO52 | C13 | TPC2 |
| IO53 | B14 | XD3 |
| IO54 | A16 | TPC3 |
| IO55 | B15 | XD0 |
| IO56 | C14 | SELB8 |
| IO57 | A17 | SELB9 |
| IO58 | C17 | FIXB9 |
| IO59 | D17 | FIXB10 |
| IO60 | B18 | SELB10 |
| IO61 | F16 | EVB9 |
| IO62 | C18 | SELB7 |
| IO63 | D18 | EVB8 |
| IO64 | F17 | EVB11 |
| IO65 | E15 | SELB11 |
| IO66 | F15 | EVB7 |
| IO67 | E18 | FIXB7 |
| IO68 | F18 | FIXB8 |
| IO69 | G17 | FIXB11 |

Bottom pins: A18/M0, C15/M1, C16/M2, U2/TD0, G3/GND1, D4/GND2, C7/GND3, D9/GND4, C12/GND5, D15/GND6, G16/GND7, K15/GND8, M16/GND9, R16/GND10, T12/GND11, R9/GND12, T7/GND13, R3/GND14, M3/GND15, K4/GND16

FIG. 12D

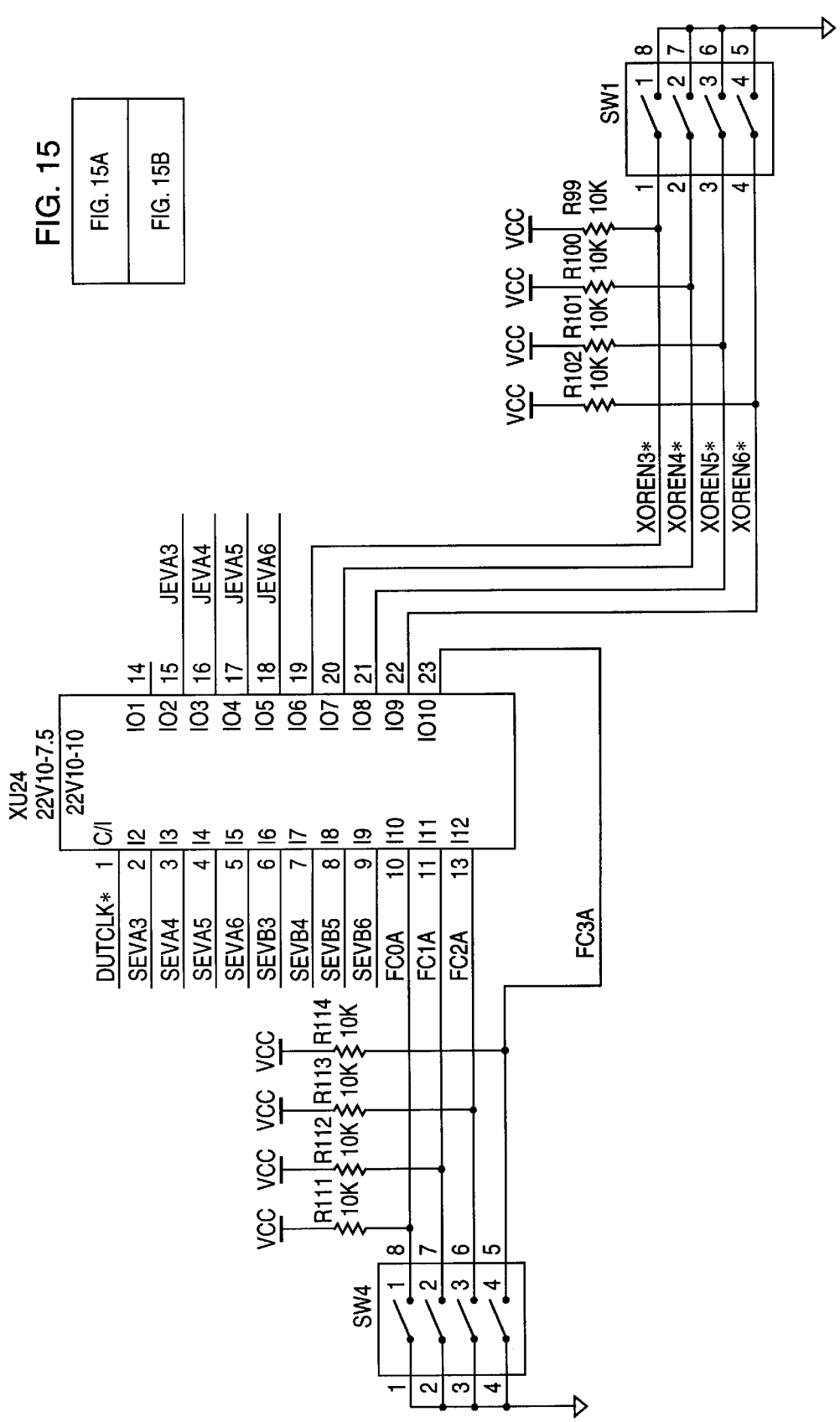

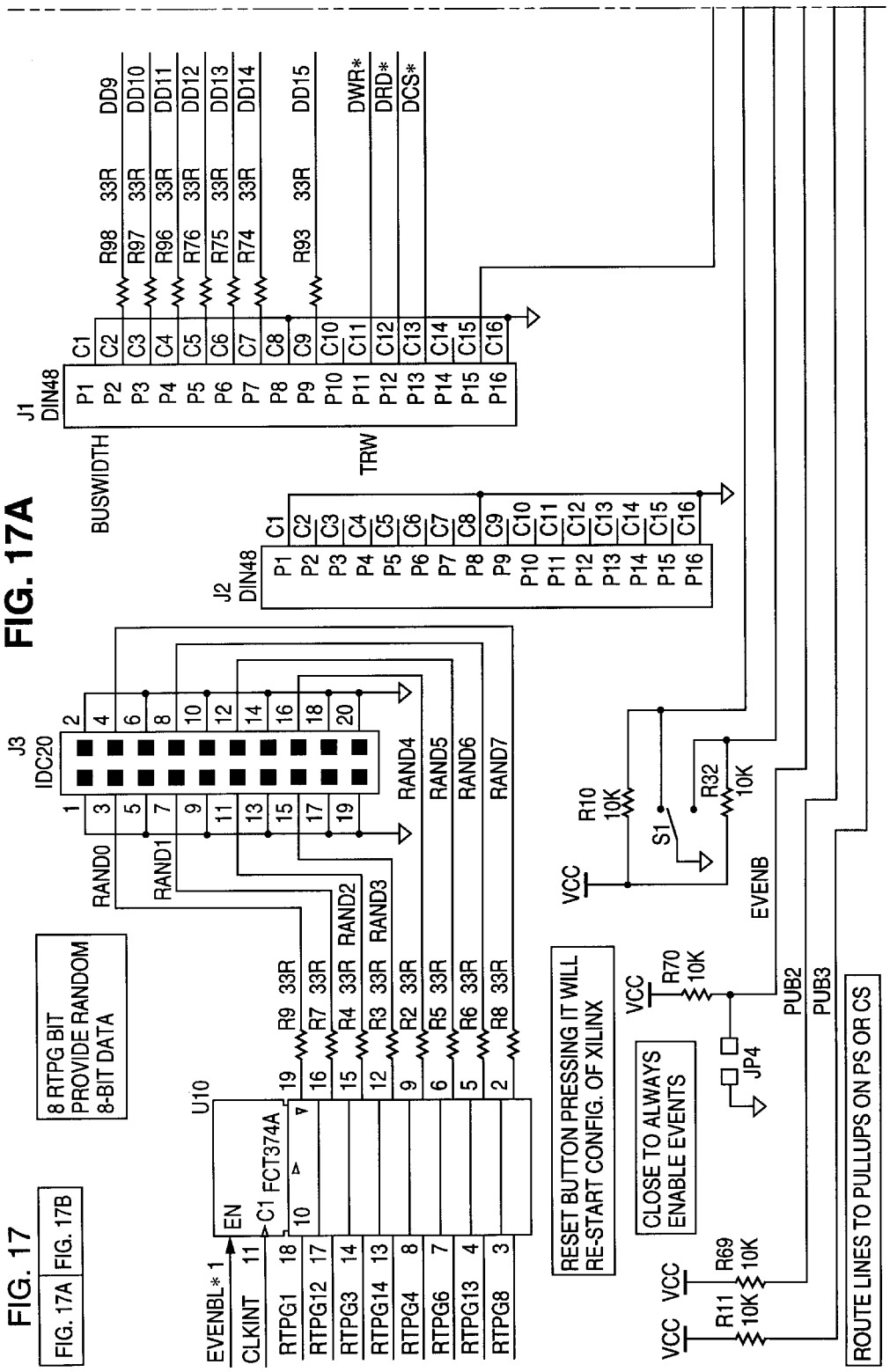

APPARATUS AND METHOD FOR DOUBLING SPEED OF RANDOM EVENTS GENERATOR

TECHNICAL FIELD

The present invention is directed to apparatus and methods for testing a clone of an integrated circuit chip to determine any discrepancies between it and the original device from which it is derived, and more specifically, to an apparatus and method for doubling the speed of a random events generator used in such testing.

BACKGROUND OF THE INVENTION

When designing a clone of an integrated circuit chip, it is best to test the design against the original device from which the clone is derived. This helps to identify any discrepancies between the cloned version and the original device, and insures that the cloned version operates in as close as possible functional manner to the device. Such testing is particularly important for central processing units (CPUs) and other complicated devices.

Typically, testing of the two devices (the cloned and original) is performed by creating a system set up which permits both devices to execute operations in parallel, and provides ways of detecting differences in the behavior of the devices. In the case of CPUs, a system can be set up that causes both devices to execute the same program in parallel while detecting any differences between the states of the two CPUs. Such differences can be a discrepancy in the results of the program (based on a memory compare) or a direct difference between the output signals of the devices (a signal compare). Typically, CPUs have the capability to respond to asynchronous external events, and such events are often used during testing of the devices. The most common type of asynchronous external event is an interrupt signal. Other possible external events which may be used for testing include external hold request signals and external bus request signals. In order to fully exercise the testing process for the two devices, it is desirable to have the ability to apply several types of external events to both devices while the devices are under test. Ideally, these external events should occur randomly while the devices are executing a testing program, but should be repeatable to enable debugging of the devices. However, the randomness requirement prohibits the use of standard event or pattern generators for generating test data. In addition to the randomness and repeatability requirements, it is also important that the event generator be capable of generating the events at the high clock speeds of current and planned devices.

What is desired is an apparatus and method for generating random, repeatable events of several types for use in testing the operation of a cloned device against the device from which it is derived. It is also desired that the random event generator be capable of operating at the high speeds necessary to properly simulate the operation of actual devices such as processing units.

SUMMARY OF THE INVENTION

The present invention is directed to an apparatus and method for generating a sequence of random, repeatable events for testing a cloned device against the device from which it is derived. The invention includes elements used to double the speed at which the event generator produces the events. This allows the event generator to be used in the testing of devices, such as CPUs, which operate at relatively high clock rates.

In one embodiment, the invention includes two event generating blocks which are clocked by separate clock signals. This causes events to be generated by each block at a rate corresponding to the frequency of the block's clock signal. The blocks have control signal inputs which determine the type, form, and occurrence of the events generated. The event generating blocks produce two independent sets of events, with the clocks having a 50% duty cycle and being 180 degrees different in phase with respect to each other. This causes events to be generated on both the rising and falling edges of the clock signals.

The clocks for the event generating blocks are derived from a master clock having a frequency which is double that of the event blocks. The master clock signal is used to control the merging of the two streams of events into a single stream having an event rate equal to that of the master clock frequency. The merging process is based on performing a logical operation between events from each of the two streams and can be implemented using a programmable logic device.

Further objects and advantages of the present invention will become apparent from the following detailed description and accompanying drawings.

DETAILED DESCRIPTION OF THE INVENTION

Figure 1:
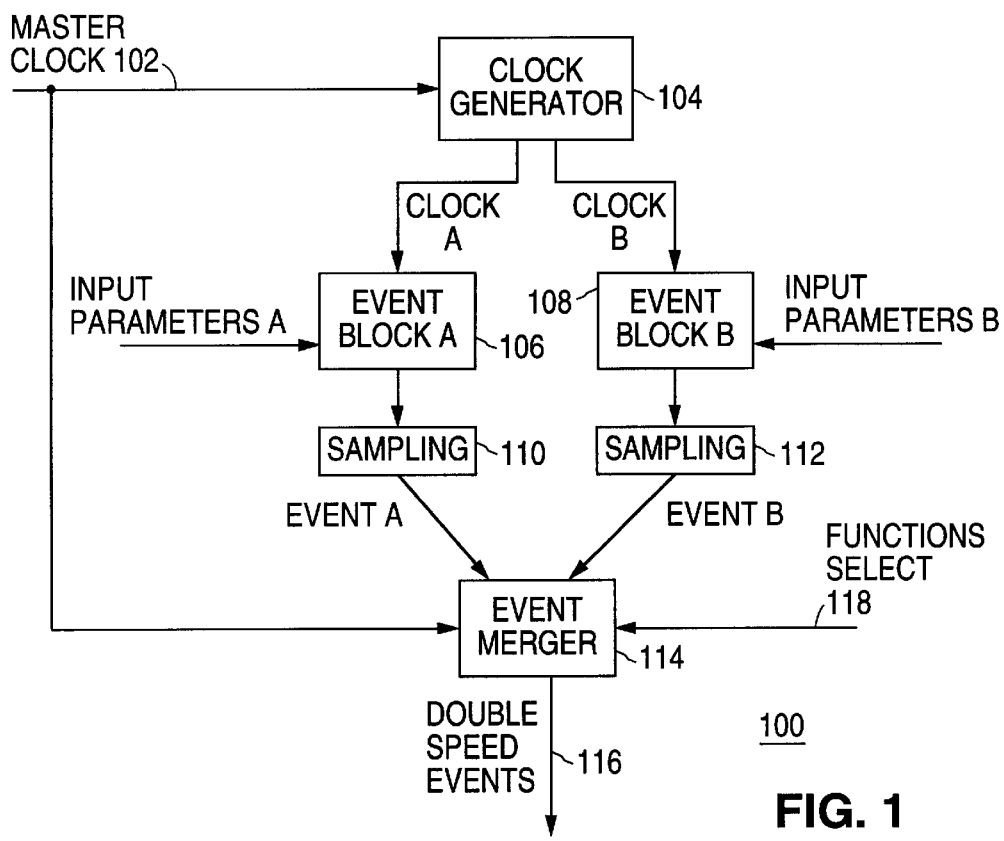
FIG. 1 is a block diagram of the double speed event generating apparatus of the present invention.

FIG. 1 is a block diagram of the double speed event generating apparatus 100 of the present invention. As shown in the figure, master clock signal 102 is provided as an input to clock generator block 104. Clock generator block 104 is responsible for generating the two clock signals (labelled "CLOCK A" and "CLOCK B" in the figure) used to operate the separate event blocks (labelled "EVENT BLOCK A 106" AND EVENT BLOCK B 108" in the figure). Typically, the master clock signal has a frequency of 2 f, and CLOCK A and CLOCK B have a frequency of f. With this relationship, the final merged event stream will have an event frequency (event occurrence rate) which is twice that of the individual event generating blocks. It is noted that other relationships between the frequencies of clock A, clock B, and the master clock may be used and are within the scope of the present invention.

Event block A 106 has as an input a set of parameters (labelled "INPUT PARAMETERS A" in the figure) that determines which, of several, event "types" is produced by the event block. Event block B 108 similarly has as an input a set of parameters (labelled "INPUT PARAMETERS B" in the figure) that determines which, of several, event "types" is produced by that block. A further description of the possible types of events will be given later with reference to FIG. 6.

Sampling block 110 is used to externally sample the events generated by event block 106. Similarly, sampling block 112 is used to externally sample the events generated by event block 108. The events generated by the event blocks are externally sampled to overcome any delay problems that might be introduced between the clock and the output(s) of the event blocks. This helps to overcome any delays introduced by the circuit elements used to generate the event streams.

The two sampled events are then merged into a single event stream by event merger block 114, which is clocked by master clock signal 102. The merging operation can be performed using one or more of a plurality of logic functions. The merging logic function is determined by the function select input 118 to event merger block 114. For example, selecting the OR logic function as the merging logic generates a high event whenever at least one of the two input events is high. Similarly, selecting the AND logic function as the merging logic generates a low event whenever at least one of the two input events is low. As indicated, other simple logic functions (or combinations of such functions) can be used to perform the merging operation. In the present embodiment of the invention, these include the OR, AND, NAND, NOR, XOR, and XNOR operations. The merging process can be implemented using programmable logic devices such as FPGAs (field programmable gate arrays), or other suitable devices.

If the clocks for the two event generating blocks are set to have a 50% duty cycle and are 180 degrees different in phase with respect to each other, then events can be generated on both the rising and falling edges of the clock signals. This allows the production of a final event stream 116 having double the event rate of each of the individual streams. This is because the master clock signal has a frequency which is twice that of the rate at which the separate event streams are generated by event blocks 106 and 108. Thus, the final output 116 of event generator 100 will consist of a stream of events having a rate twice that of the rate at which the individual event blocks operate.

Although the case of clocks for the two event generating blocks having a 50% duty cycle and being 180 degrees different in phase has been described, other combinations of duty cycle and relative phase shift may be used. For example, if the event streams from four event generating blocks are merged, then four clocks would be used with a relative phase difference of 90 degrees.

If it is desired that the event applied to the Device Under Test have a period less than the clock cycle time, then a duty cycle of less than 50% may be desirable. This could be useful in cases where the Device Under test uses edge triggered external events. In such cases, it is beneficial to ensure that a specific edge is detected even if the pulse providing the edge has a short duration.

A combination of event clocks having other than a 50% duty cycle and relative phase shift of 180 degrees can be used to provide events of varying lengths. This type of event stream can also be generated by using a greater number of event generating blocks the outputs of which are merged together at a higher master clock frequency.

Figure 2:
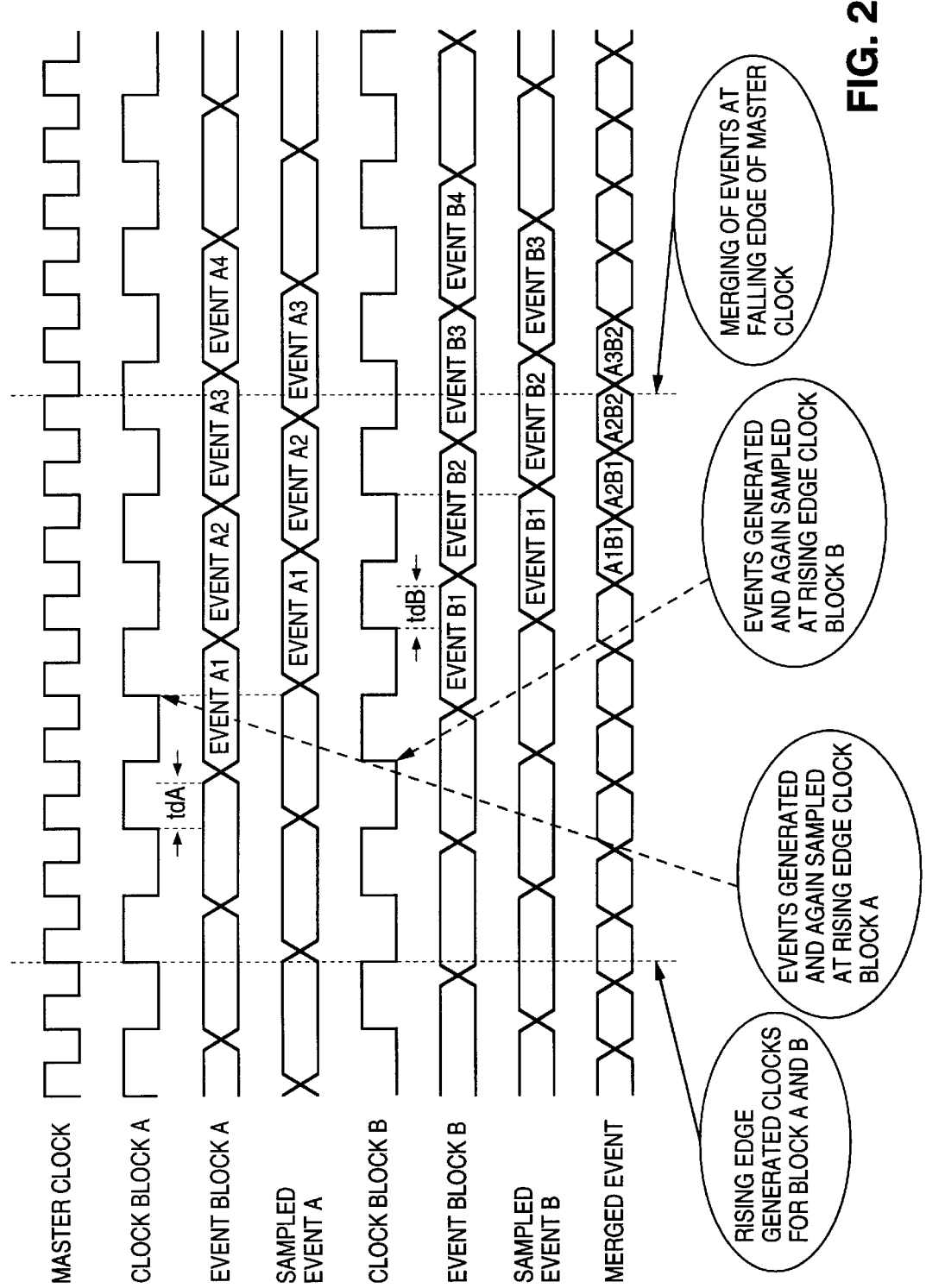
FIG. 2 is a timing diagram showing the relationships between the master clock, event generating clocks, and the generated and merged events for the double speed event generating apparatus of the present invention.

FIG. 2 is a timing diagram showing the relationships between the master clock, event generating clocks ("Clock Block A" and "Clock Block B"), and the generated ("Event Block A" and "Event Block B") and merged events ("Merged Event") for the double speed event generating apparatus of the present invention. The signals shown in FIG. 2, except for the merged event, are generated on the rising edge of the respective clock signals. The clock to output delay of the lower speed events are denoted by "tdA" for event block A and "tdB" for event block B in the figure. As mentioned, in an FPGA based system, the clock to output delay may be significant. For this reason, the events are externally sampled ("sampled event A" and "sampled event B" in the figure) using the same clock as used for the event generation logic. At the final stage, the two event streams are merged using the falling edge of the master clock signal. This results in a random, repeatable event stream being produced at the falling edge of the master clock.

The double speed random event generating apparatus of the present invention has been implemented in the form of a card intended for use with CPU test systems and functional testers. The principle of these test systems is to verify functionality of a specific device, by 'bombarding' it with a very large number of random tests. Typically, these tests are a combination of a random sequence of opcodes and a number of external events presented at the CPU at a random point in time. The entire sequence is fully repeatable to allow debugging in the case of test failure.

With a CPU being the device under test, the external events could be interrupt signals, external wait state signals, or any other signal that may be presented to the device at any given point in time. As mentioned, the external event to be presented to the Device Under Test (DUT) should have a random nature. However, typical external events such as interrupts or HOLD inputs, will have some sort of limitation with respect to polarity and/or shape. A typical example would be a minimum active time for an external interrupt signal. Another common property which it is desirable to control is event polarity (active low interrupt vs. active high). To overcome this problem, the apparatus design includes specific logic allowing the test engineer to control the actual shape of the event(s) generated.

The actual random event is generated from random data. The random data is generated by a Random Pattern Generator. Dedicated logic is then used to 'shape' the random data into the desired event that is to be presented to the DUT.
Random Pattern Generator Random event generator blocks 106 and 108 of FIG. 1 include a so-called Random Pattern Generator block (RTPG). This block creates 16 bits of pseudo-random data every clock cycle. Subsequent logic (the event shaping blocks) uses this data to generate the actual events. Due to the random nature of the input data to the event shaping blocks, the outgoing events also have a random nature.

Figure 3:
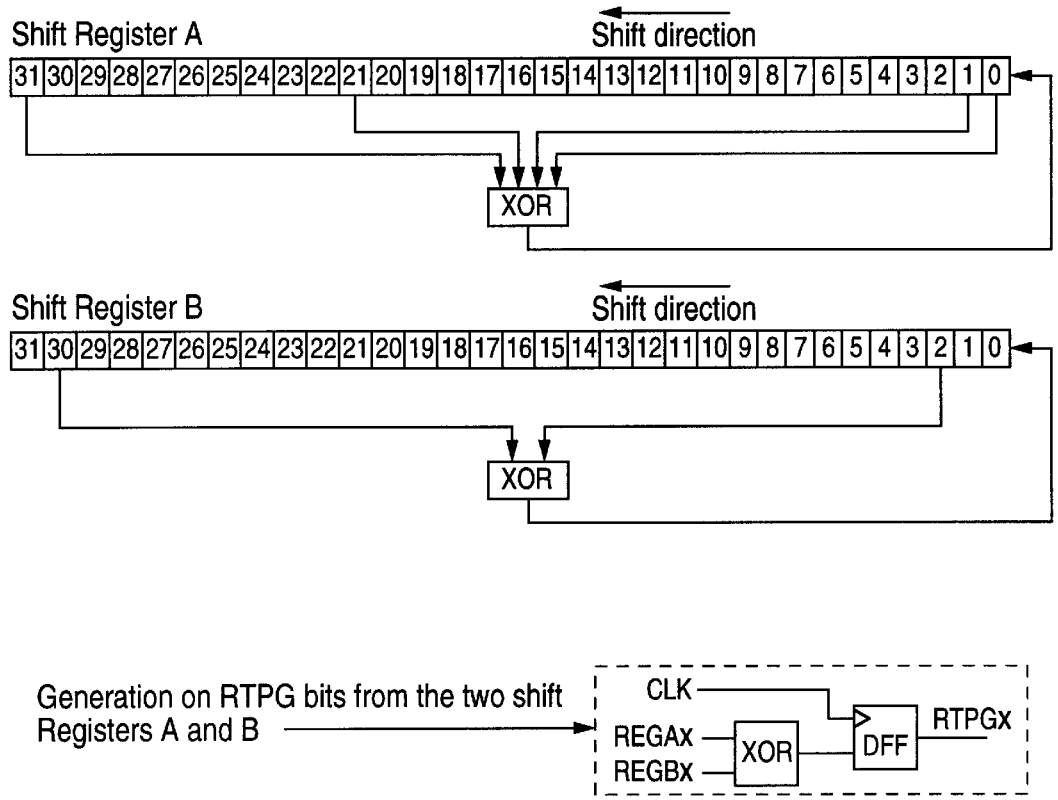
FIG. 3 is a functional block diagram of the Random Pattern Generator block which is part of the event blocks used in the double speed event generating apparatus of the present invention.

The RTPG consists of two 32 bit shift registers with feedbacks at several nodes. FIG. 3 is a functional block diagram of the Random Pattern Generator block which is part of the event blocks used in the double speed random event generating apparatus of the present invention. Selected bits of the two shift registers are combined (using an XOR operation) to generate a 16-bit pseudo-random pattern. The dotted box in the figure shows how the x-th bit of the RTPG output (shown as "RTPGx" in the figure) is produced from the x-th bit of register A (shown as "REGAx" in the figure) and the x-th bit of register B (shown as "REGBx" in the figure). A table showing how the output bit varies with the position of the register's bits is also shown in the figure. Four 16 bit SEED registers are used to initialize the RTPG. The generated 16-bits of pseudo-random data will repeat itself only after $2^{32}$ clock cycles. The pseudo-random data generated is fully repeatable for any given SEED value.

Event Shaping Block

Figure 5:
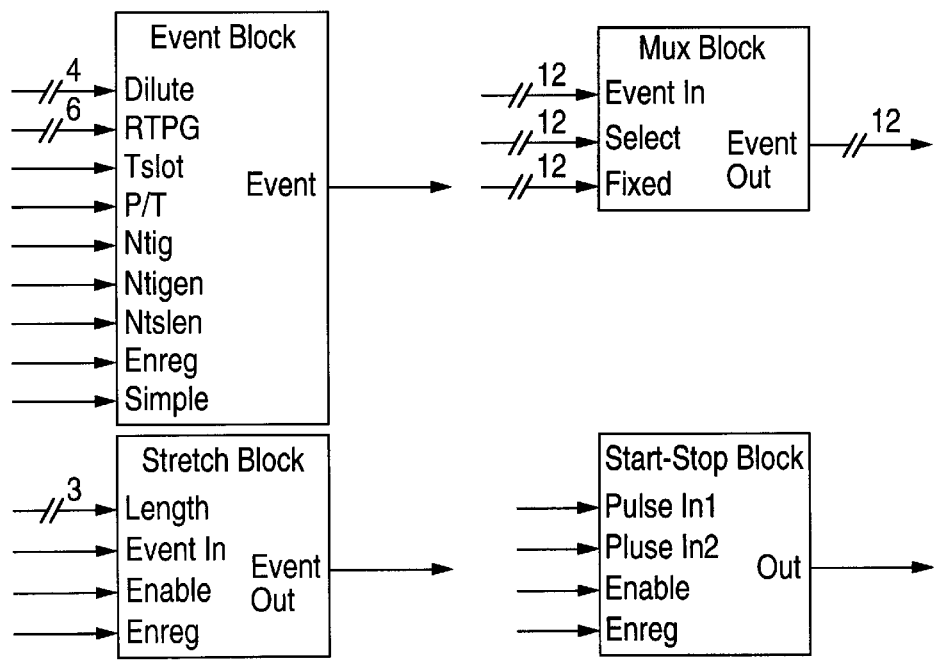
FIG. 5 shows the inputs and outputs for each of the event building blocks contained in the event shaping block shown in FIG. 4.
Figure 4:
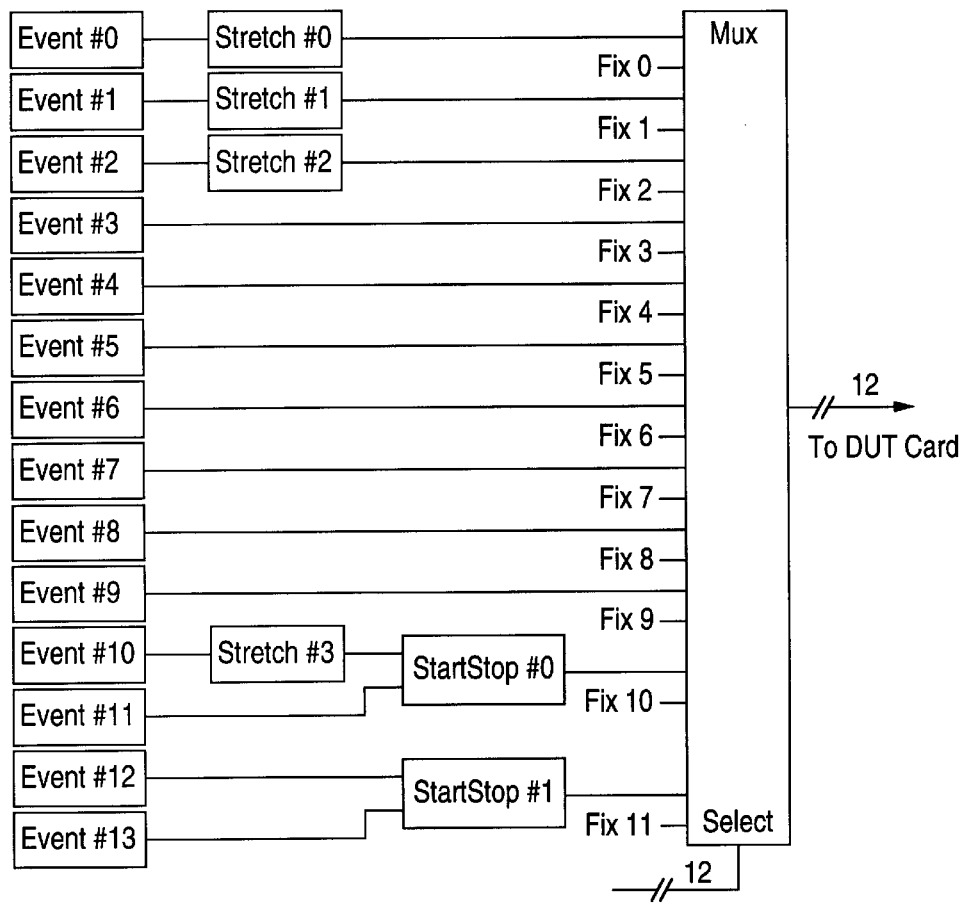
FIG. 4 is a block diagram of a single event shaping block.

Random event generator blocks 106 and 108 also include an event shaping block. The event shaping blocks are the same for each event generator block. Each event shaping block can produce up to 12 types of events, with each block being independently clocked. FIG. 4 is a block diagram of a single event shaping block. As shown in the figure, the event shaping block is composed of event blocks, stretch blocks, startstop blocks, and a mux block. FIG. 5 shows the inputs and outputs for each of the event building blocks contained in the event shaping block shown in FIG. 4.

Referring to FIG. 5, an event is generated in the event block using the data provided by the RTPG of FIG. 3. Generation of the event input signals control what event is generated. The "P/T (Pulse/Toggle)" signal of the event block controls if the event generated will be of pulse or toggle type. The control signal "Simple" selects between simple and non-simple mode.

Figure 6:
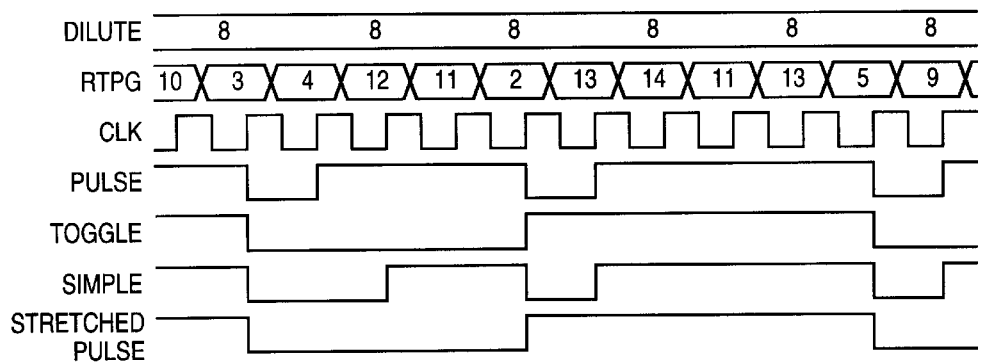
FIG. 6 is a diagram showing the signals corresponding to the various event types.

FIG. 6 is a diagram showing the signals corresponding to the various event types. These are briefly described below:

(1) Pulse

A one clock period pulse for every event that occurs;

(2) Toggle

A toggle event toggles every time an event occurs;

(3) Simple

A simple event goes active (low) whenever an event occurs. note the difference with the pulse event. A pulse event can only go low for one clock cycle (that's the whole idea of a pulse), but the simple event will go active as long as the event is valid;

(4) Stretched Pulse

Same as Pulse, but the event will be forced active for a longer (programmable) duration.

The current implementation of the present invention contains two event blocks, each of which can generate 14 events, with 12 being available as outputs of the block. Each block is independently clocked. The user is able to determine what clock will be used to clock the blocks. Typically, both are clocked with the same clock. However, since the frequency may be limited by the hardware implementation, the user may choose to clock the event blocks with different clocks to be able to obtain events at different clock edges or at a higher rate.

Event Merging Logic

As mentioned, the maximum allowed operating frequency of the event generating blocks may be set by delays internal to the parts (such as FPGAs) used to implement the event generation. However, this limited event generation rate may not be suitable for properly testing devices which operate at higher speeds. To provide an event stream having a higher event occurrence rate, the present invention is capable of merging two independent event streams into a single one. If the first event stream is clocked with the opposite phase clock of the second one, this will result in an event being generated on both the rising and the falling edge of the event clock(s).

Figure 7:
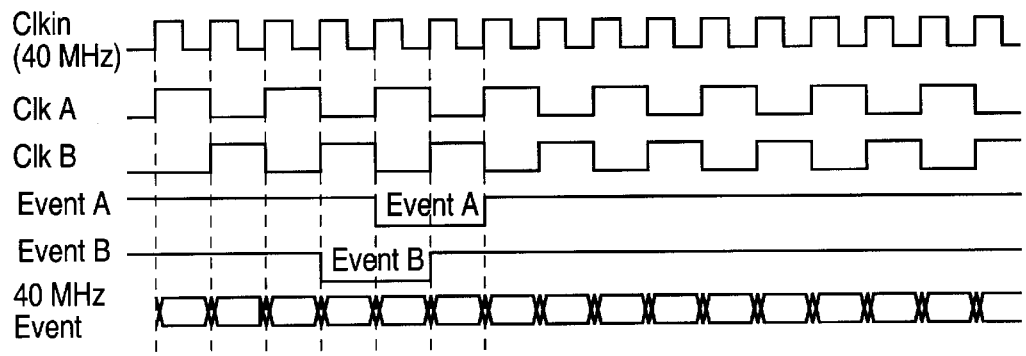
FIG. 7 is a timing diagram showing how a higher event generation rate can be obtained by merging two lower speed event streams.

FIG. 7 is a timing diagram showing how a higher event generation rate can be obtained by merging two lower speed event streams. In the diagram, the main clock signal has a frequency of 40 MHz. This is too high a frequency for events to be generated by the components typically used to generate the actual events. This is because such components are typically not state of the art devices. Therefore, the input frequency of the master clock must be divided down. Since both event blocks can be clocked independently, a choice was made to clock block A with the inverse clock signal of block B. In this situation, events are generated on every rising edge of the main clock, first an event from block A, then from block B, then from block A, and so on. The merging logic contained in event merger block 114 of FIG. 1 takes the event streams from blocks A and B and merges them together at the frequency of the main clock (in this case 40 MHz). The resulting event stream thus has an event frequency of 40 MHz.

Note that as high density devices are built using smaller geometry processes, the event generating circuitry can be implemented in devices which operate at higher frequencies. However, the operating frequencies of devices which need to be tested are also increasing, so there is still a need for a random event generator which can generate events at these increased frequencies. Thus, the event frequency doubling apparatus and method of the present invention may still be needed in situations where the event generating blocks operate at a lower frequency than the device to be tested.

DIP switches can be used to allow selection of the merging logic function performed on the events from blocks A and B. In the present embodiment, eight events from block A and B can be merged together into a stream of eight high speed events. The remaining four events from each block are limited to the lower clock speed of each event block.

As discussed, the main reason for use of the inventive event merging logic is to be able to generate events at higher frequencies than those at which the event generating blocks can operate. Due to the complex nature of the actual random event generation logic, the FPGA implementation used does not run at the high clock speeds needed to properly test some types of devices. A full or semi-custom implementation (e.g., in the form of an ASIC) could be used to solve this problem (note that an ASIC could also be used to implement the event frequency doubling circuitry). However, in the case of a card where only a few prototypes are required and built, the overhead involved with doing an ASIC implementation would not be justified.

As noted, the implementation of the present invention described allows the user to select different functions for performing the 'merging' operation. The main reason for providing user selection of the merging function is that the event generator is intended to be used with, or as part of, many different test systems. It is not possible to determine what merge function will be best to use without knowing in detail the intended use of the merged event stream.

For example, if the two events that are to be merged are set to negative polarity and are to be used for an active low interrupt line to a CPU with a relatively small stack, choosing the AND function would not be wise. The AND function will produce a low output every time one of the event block produces an event. Unless the event density (control of the number of events per time unit) is set to a very low value, the CPU would most likely be saturated with events, causing stack overflow and test failure. In this case, it would be best to use the OR function. In such a case, an interrupt will be generated only if both event blocks (independently) produce an event. There will most likely be less interrupts, but the random nature of the testing events will be maintained. By running tests over a long enough period of time, the random nature of the event will ensure good coverage of the test operation.

Event merging logic was implemented as part of the present invention to permit producing a higher speed event stream as an output using a lower speed clocking of the individual event generators (see the discussion of the RTPG implementation). The capability to select the event merging function was provided to permit flexibility in selecting the appropriate shape of the event being presented to the DUT. The principle of a total test system, of which the present invention is a part, is to run a very large number of randomized tests combined with random events. The idea behind this approach is that running random test vectors over a long enough period of time will detect design and/or implementation problems. The event merging function enables generation of events at double the speed, without interfering with the random nature of the events presented.

Figure 8:
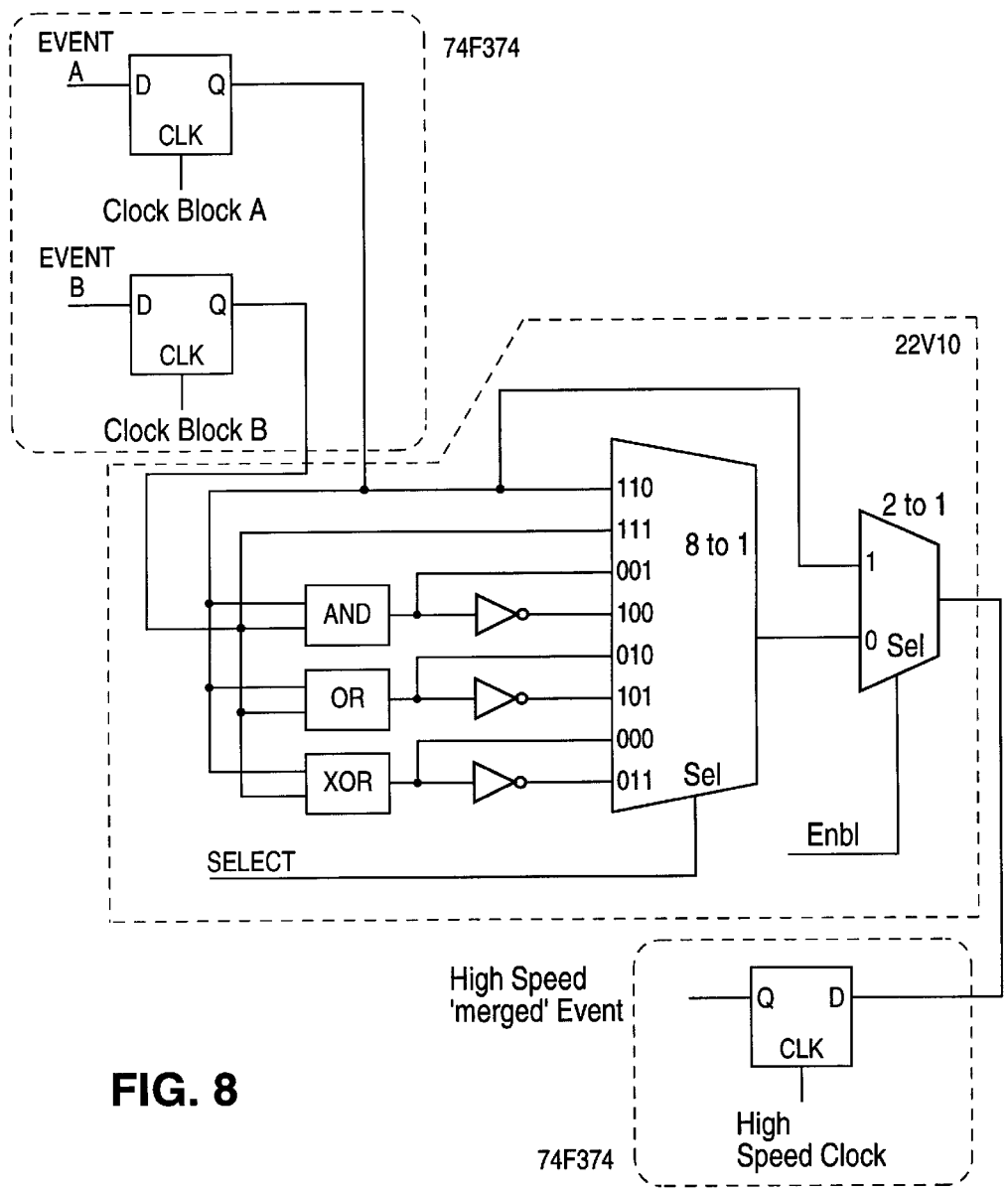
FIG. 8 is a schematic block diagram showing how events generated by the two event generator blocks are merged by the event merging logic to produce a final event stream which is sampled at a higher clock rate.

FIG. 8 is a schematic block diagram showing how events generated by the two event generator blocks are merged by the event merging logic to produce a final event stream which is sampled at a higher clock rate. As shown in the figure, event blocks A and B are clocked by clock signals provided by clock blocks A and B, respectively. The outputs of the event blocks are provided to the event merging logic. The event merging logic is shown as logic elements which generate the various possible logical combinations of the two inputs, and a multiplexer having a select control line for selecting which of the possible logical results is supplied as the output of the merging logic. The output of the merging logic is sampled at a high clock rate provided by the clock generator logic, and operates at a higher rate than the clocks used to operate the event generator blocks.

In the current implementation of the present invention, 22V10 programmable array logic (PAL) is used to provide a minimal delay between inputs to and outputs of the event merging block. The event merging logic is implemented in the form of programmable logic devices (PLDs). The source code for the PLDs is contained in the appendix to this application. The flip-flops placed before and after the multiplexer blocks are implemented externally (using 74F374 devices).

Figure 9:
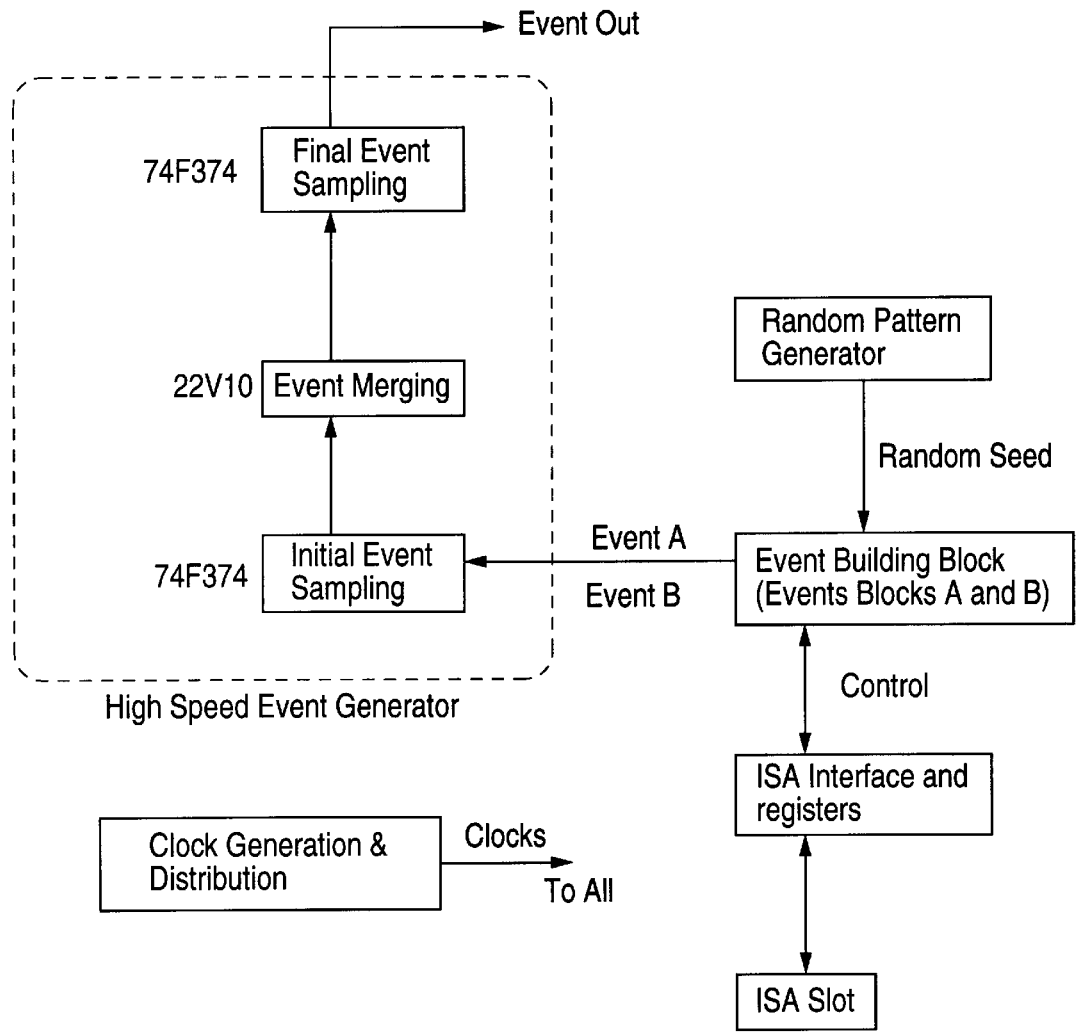
FIG. 9 is a block diagram overview of the relationships between the schematic diagrams of the elements of the double speed event generating apparatus of the present invention.

FIG. 9 is a block diagram overview of the relationships between the schematic diagrams of the elements of the double speed event generating apparatus of the present invention. As shown in the figure, the events generated by event blocks A and B are subjected to an initial sampling. This is done to ensure that the clock to output delay is the same and kept to a minimum for all events, an aspect which is difficult to control directly with FPGAs.

Figure 10A:
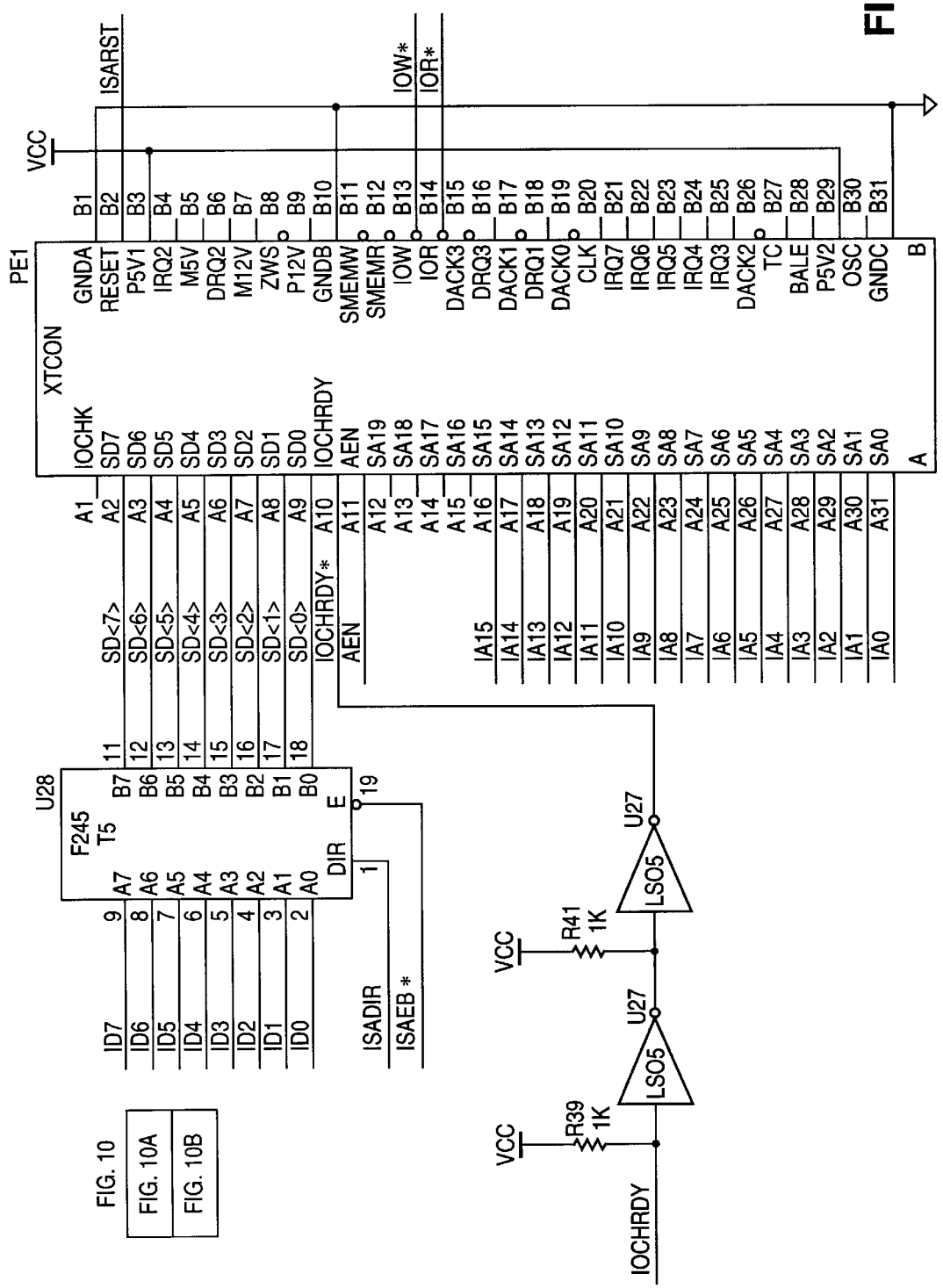
FIG. 10 is a schematic diagram of the ISA header.
Figure 10B:
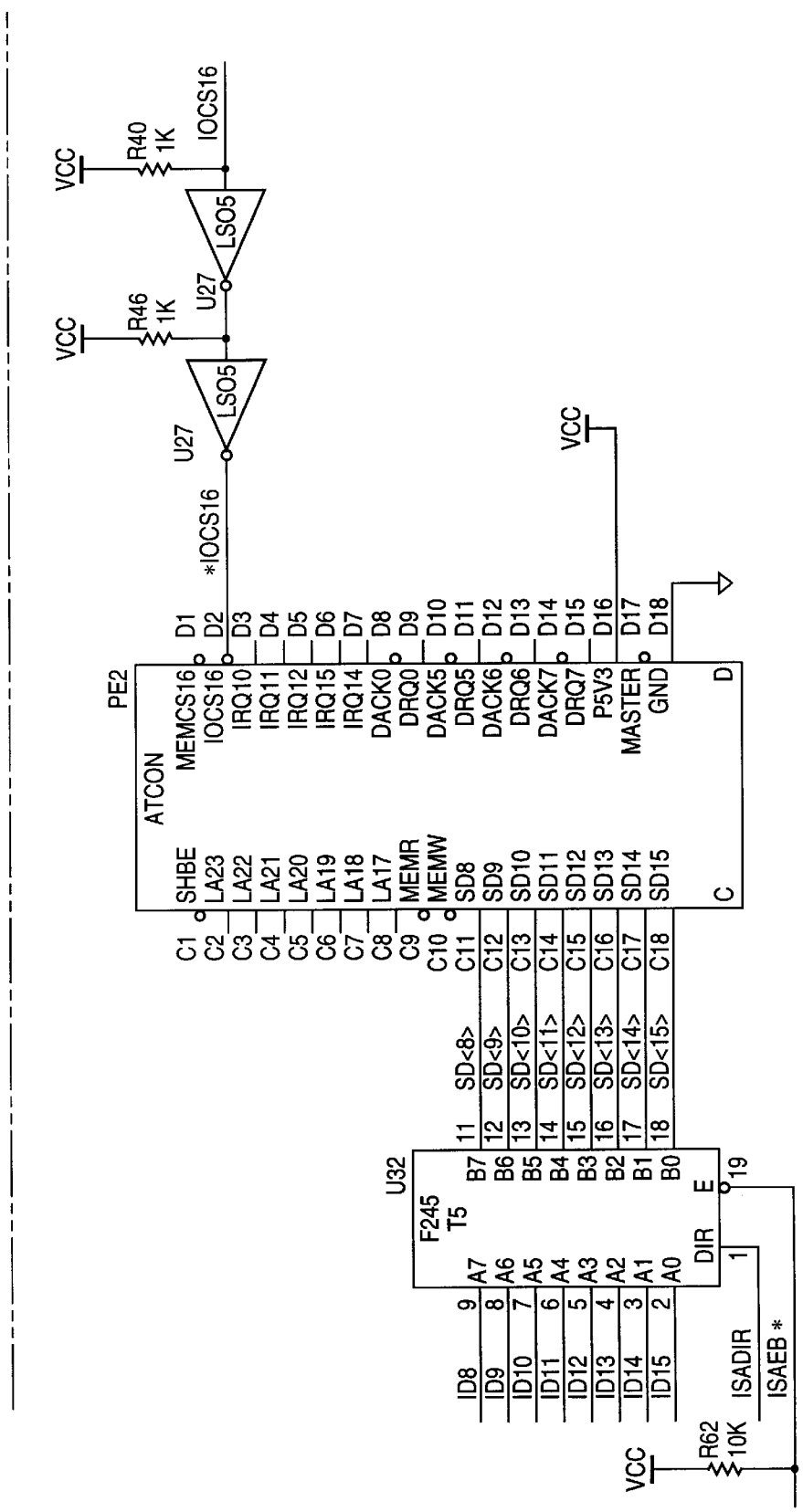

FIG. 10 is a schematic diagram of the ISA header. The diagram shows the connection to ISA. In addition, some buffers to buffer the ISA databus and provide the required 24 mA sink current to ISA are shown. The open drain drivers for IOCHRDY are also shown.

Figure 11A:
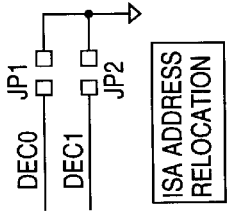
FIG. 11 is a schematic diagram of the ISA interface.
Figure 11C:
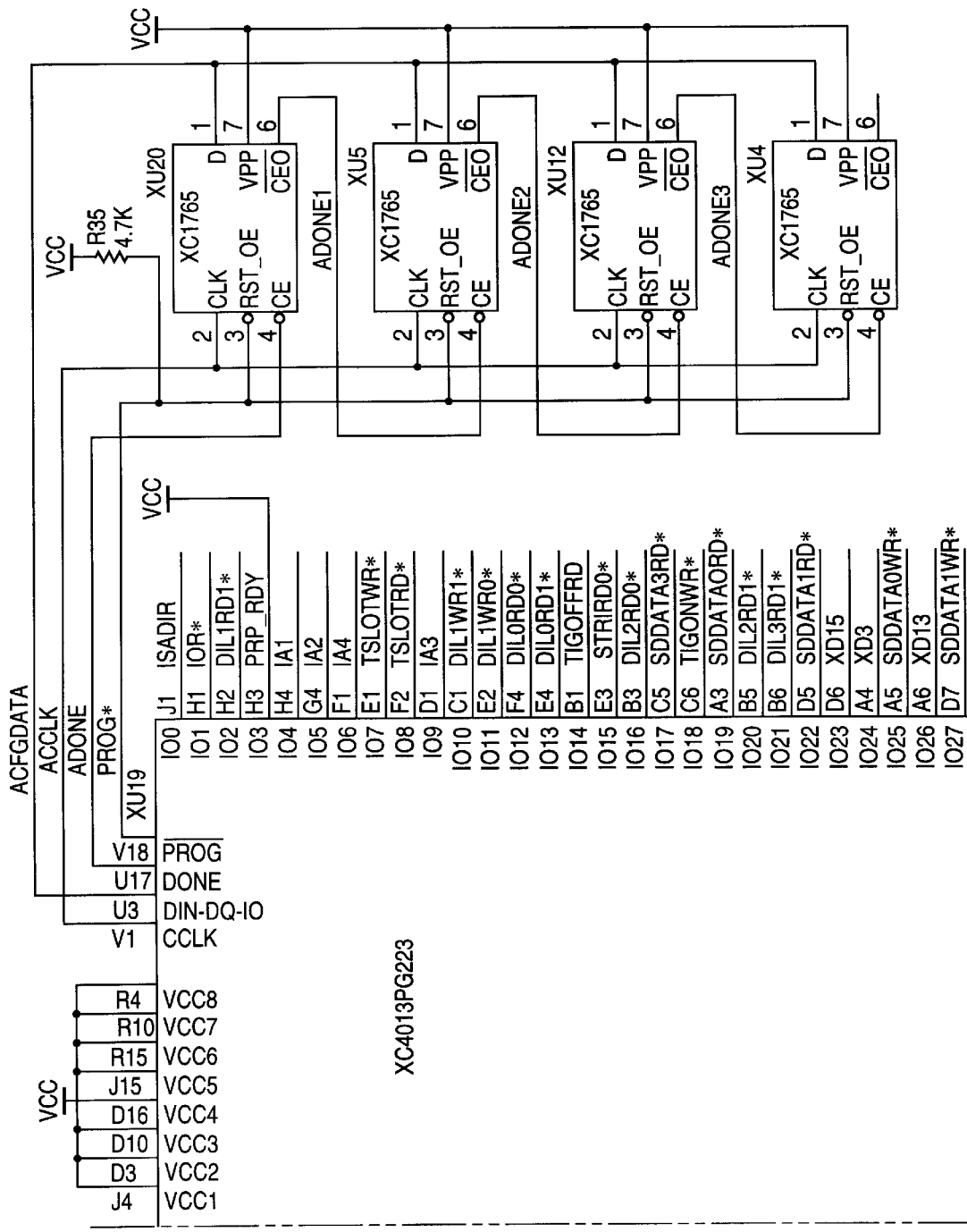
Figure 11D:
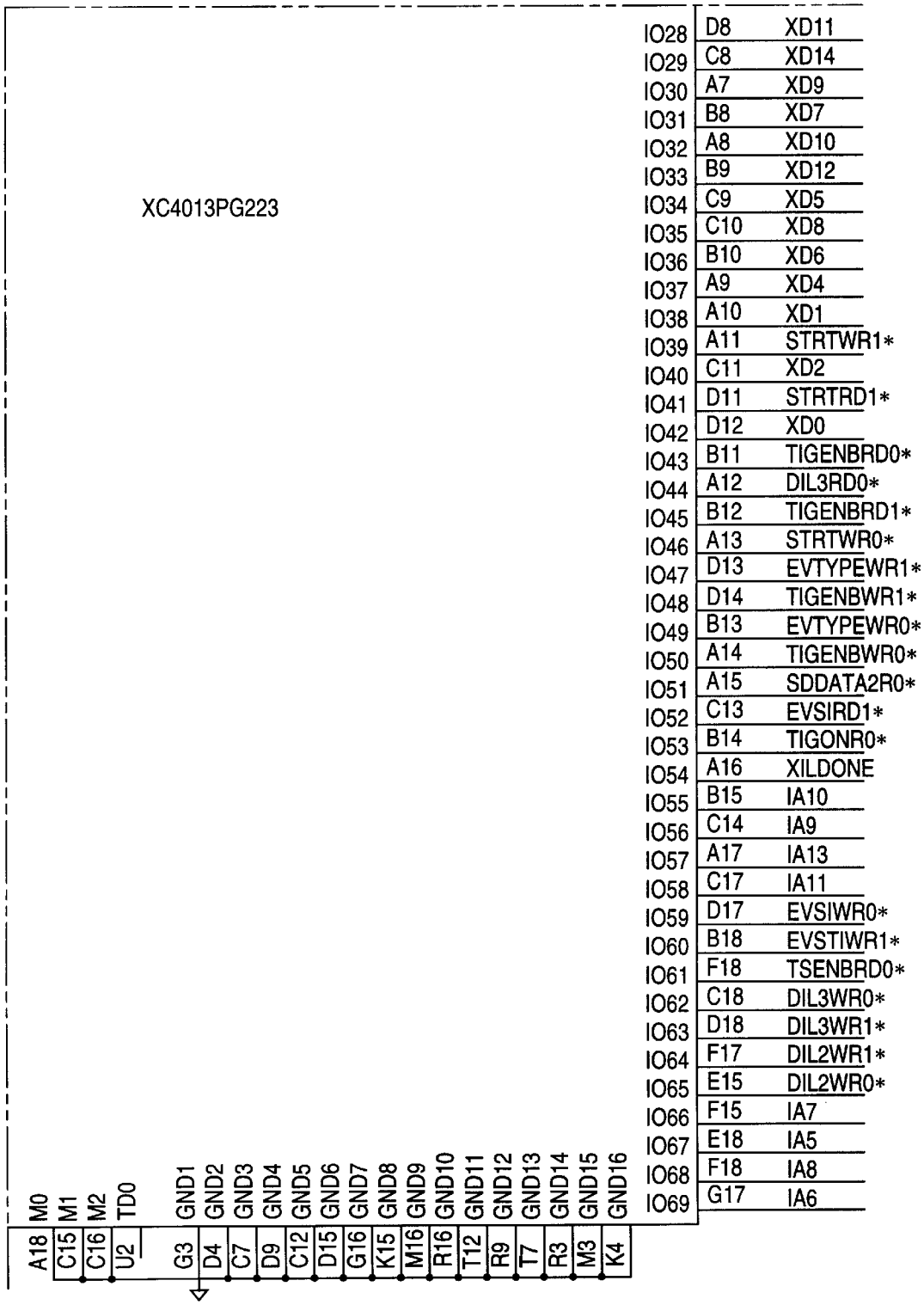

FIG. 11 is a schematic diagram of the ISA interface. The interface is implemented inside a Xilinx XC4013 FPGA. In addition, the FPGA contains a 32 bit timer and an internal register used for event generating control. The ISA interface converts ISA read and write cycles to read or write cycles on an on-board bus.

Figure 12C:
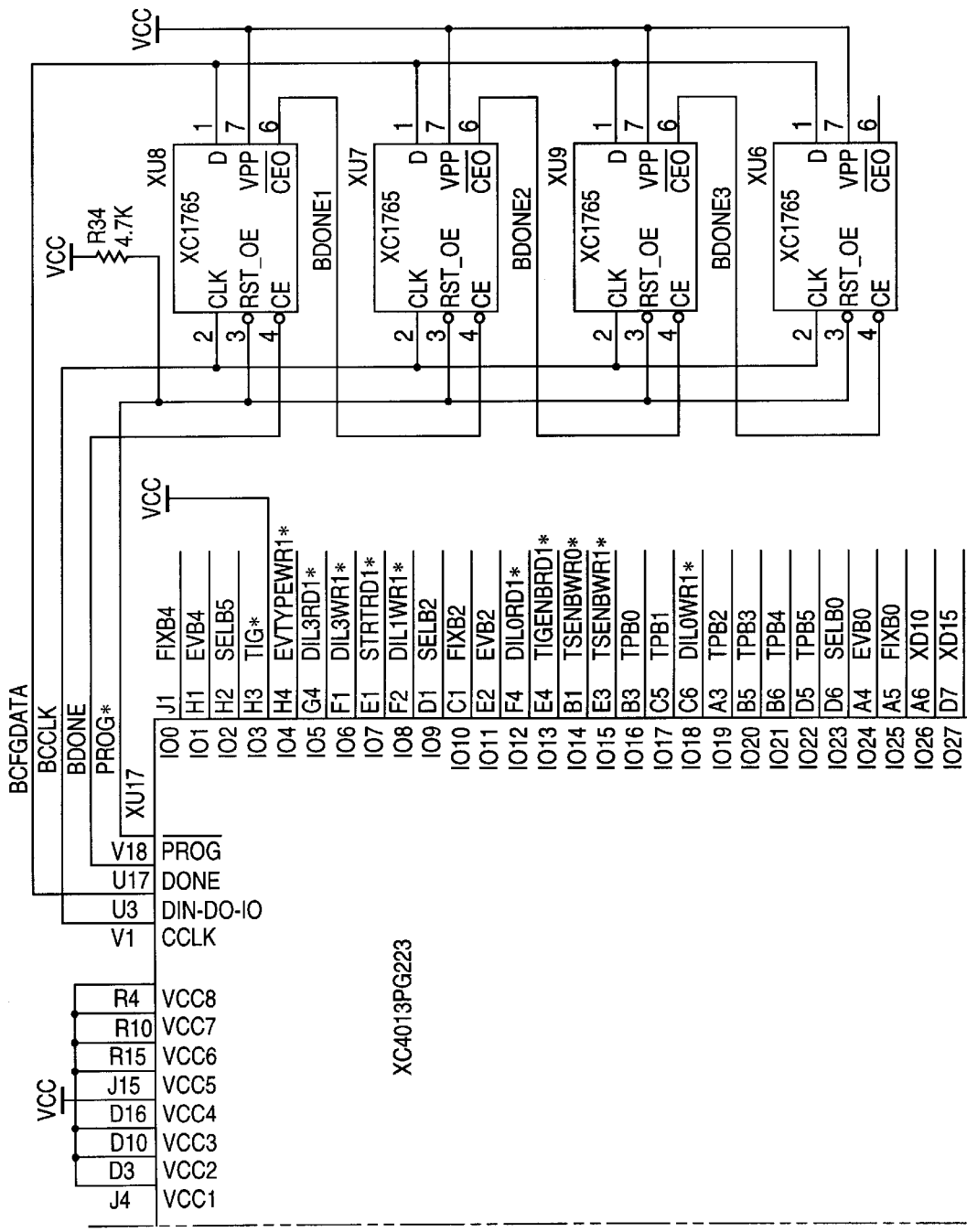
FIG. 12 is a schematic diagram of the event generating blocks.

FIG. 12 is a schematic diagram of the event generating blocks. As discussed, the purpose of the present invention is to generate random events. However, these events should be controllable in some way, e.g., control of minimum duration, maximum duration, probability of occurrence, etc. This is done via registers and control blocks. These circuit elements are implemented inside another Xilinx XC4013 FPGA, shown in FIG. 12. Two completely separate blocks are implemented, Block A and B. Both reside in the same FPGA, but are clocked independently.

Figure 13A:
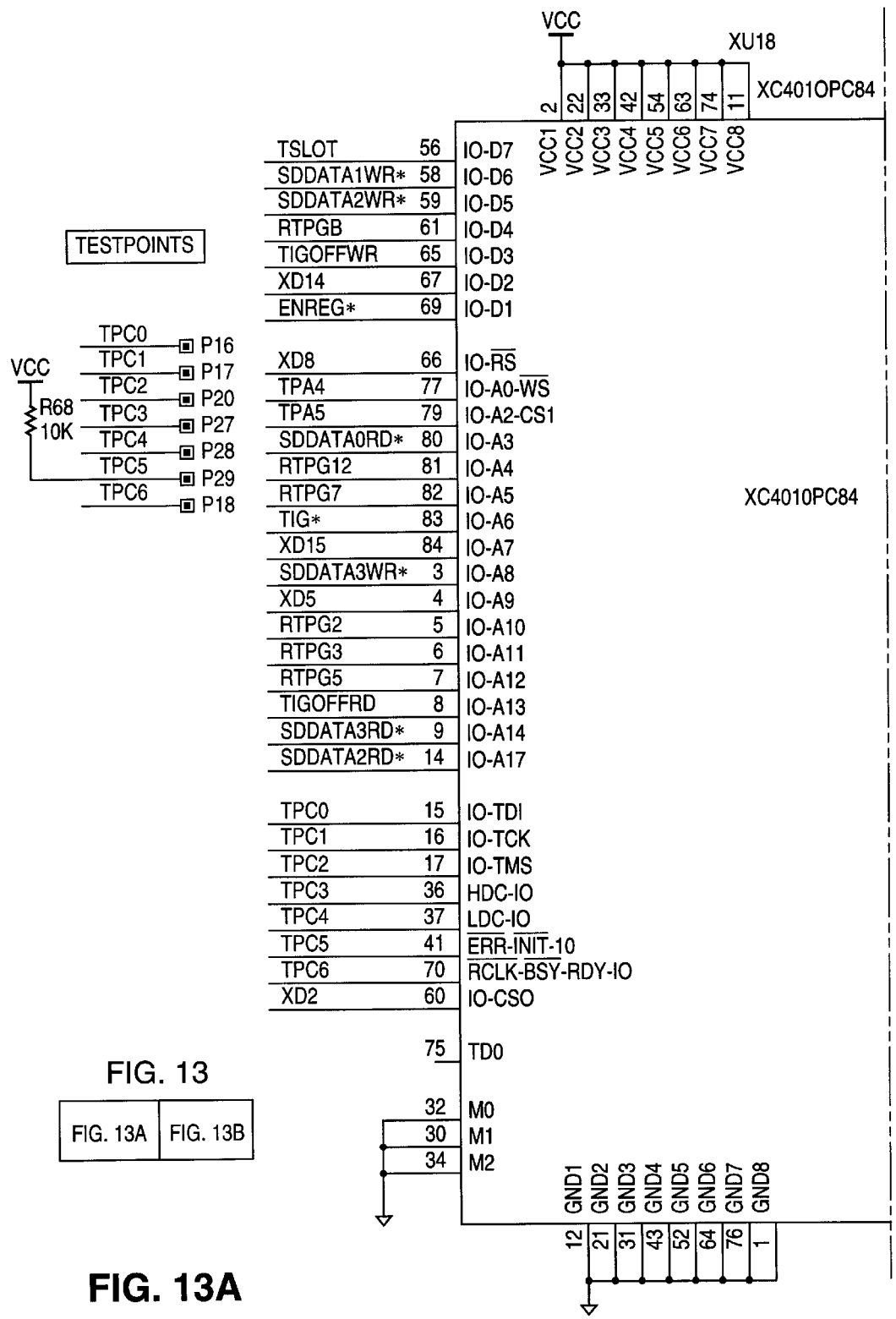
FIG. 13 is a schematic diagram of the RTPG generator of FIG. 3.
Figure 13B:
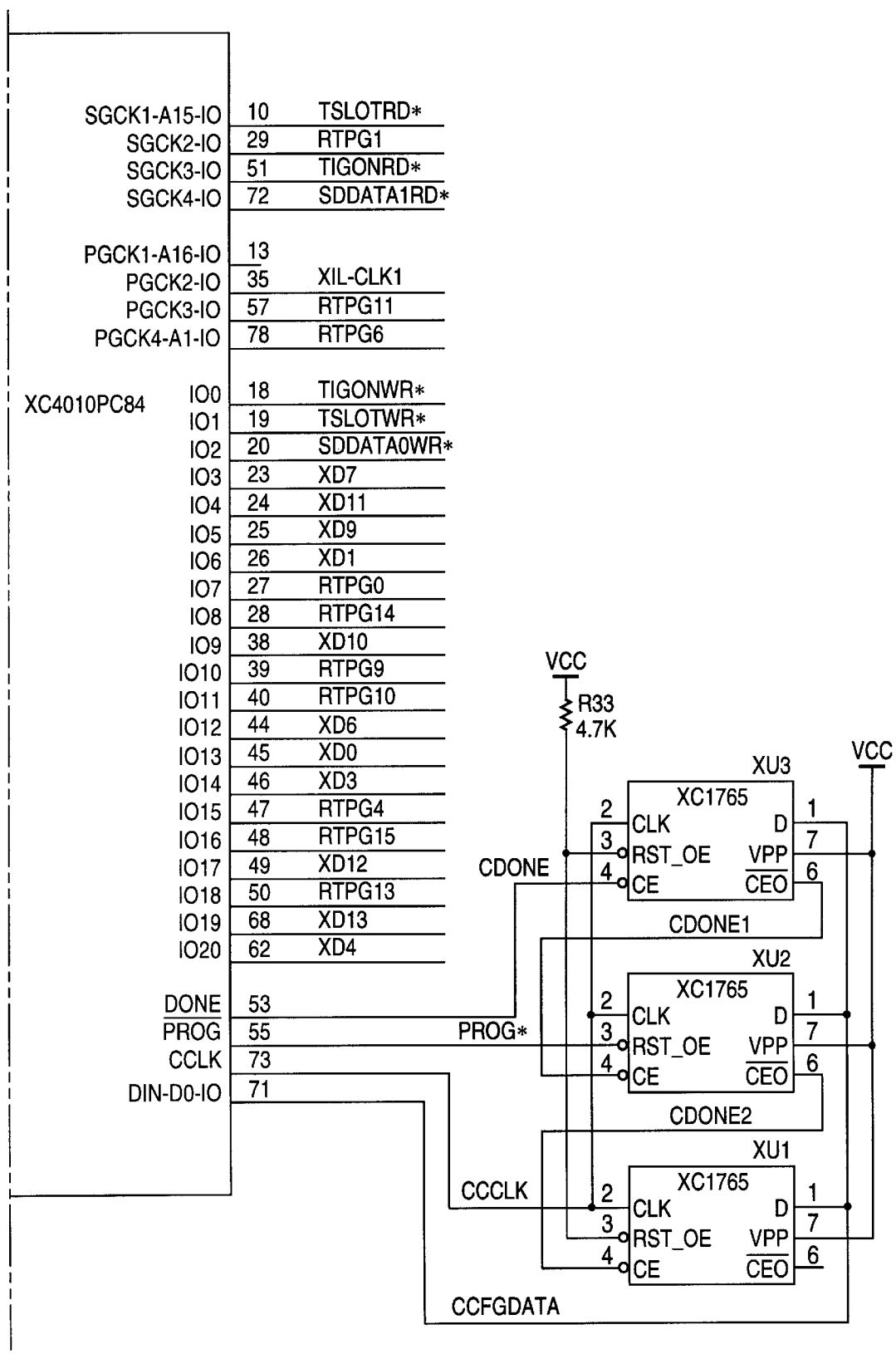

FIG. 13 is a schematic diagram of the RTPG generator of FIG. 3. As discussed, the basis for the randomness of the events is a random pattern generator, which is implemented in a XC4010 FPGA from Xilinx. The generator provides a 16 bit random value every clock cycle. The event building blocks of FIG. 12 use this value to generate the events.

Figure 14:
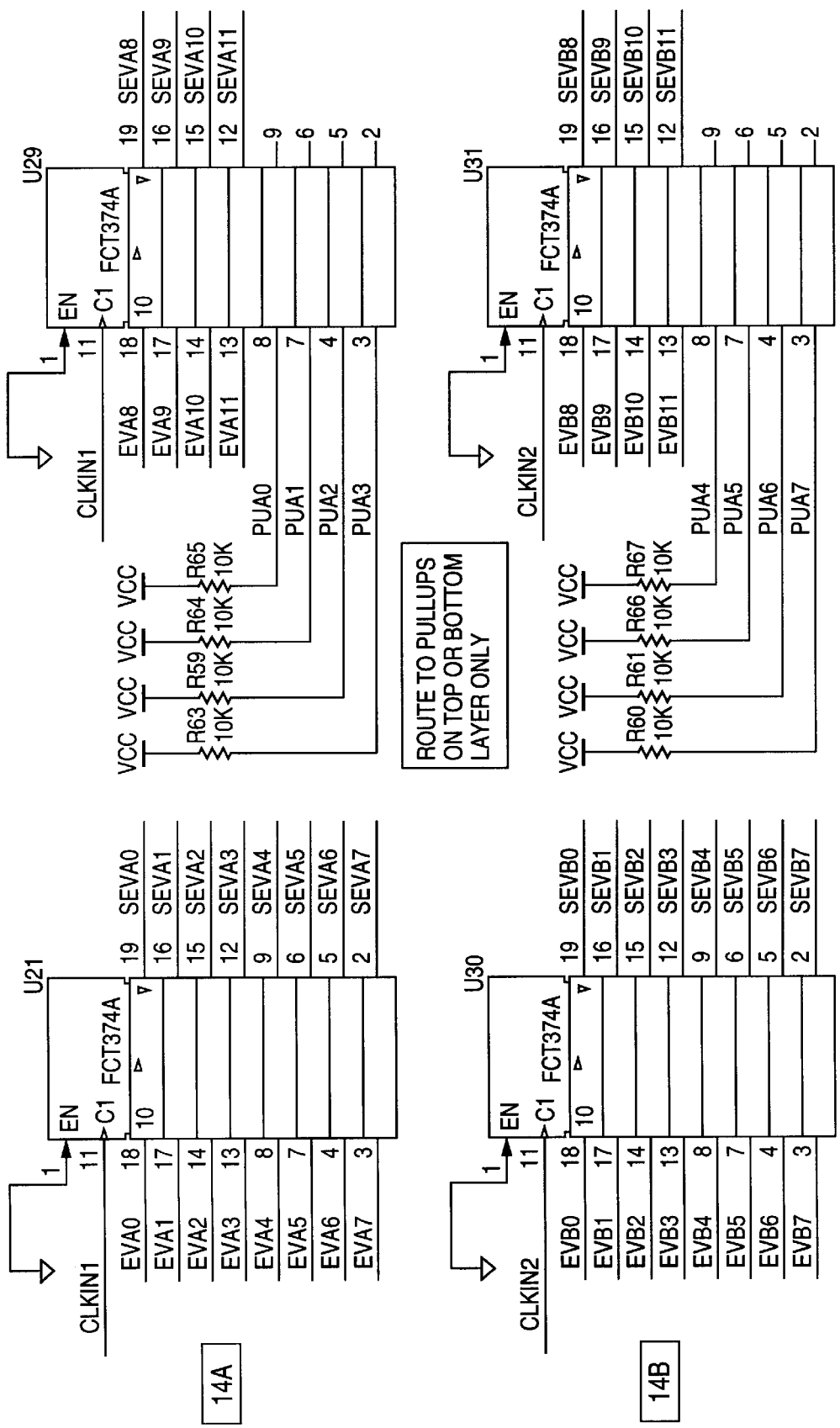
FIG. 14 is a schematic diagram of the clocks used for initial sampling of the events.

FIG. 14 is a schematic diagram of the clocks used for initial sampling of the events. Once the events are generated in the FPGA of FIG. 12, they are sampled using the same clock that generated them. This ensures that all events have an almost equal clock to output delay.

Figure 15B:
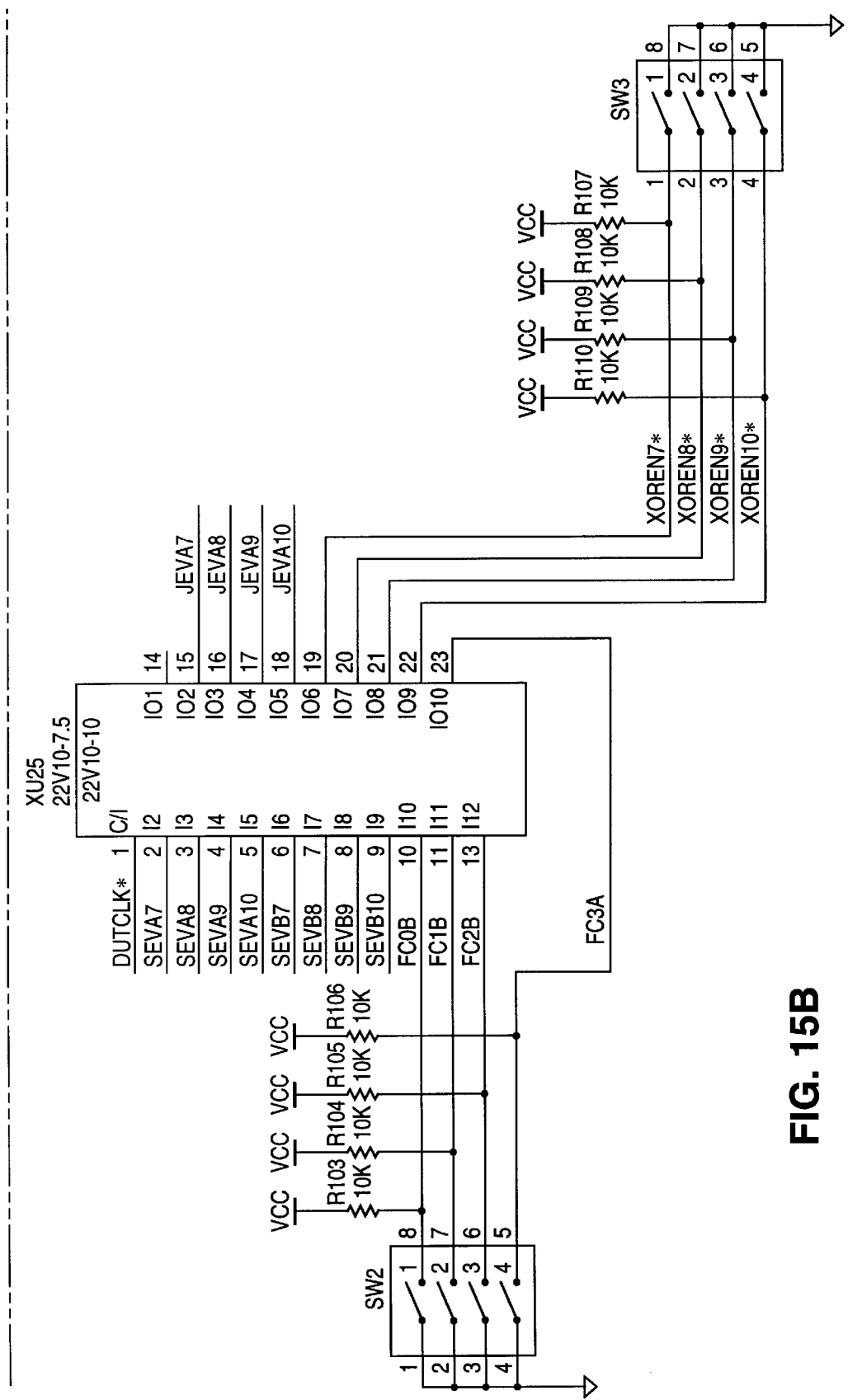
FIG. 15 is a schematic diagram of the event merging logic.

FIG. 15 is a schematic diagram of the event merging logic. The figure shows the two PLD devices that perform merging of the event streams, with the logic implemented being determined based on jumper settings. The output of the PLD's is provided to the schematic shown in FIG. 16.

Figure 16:
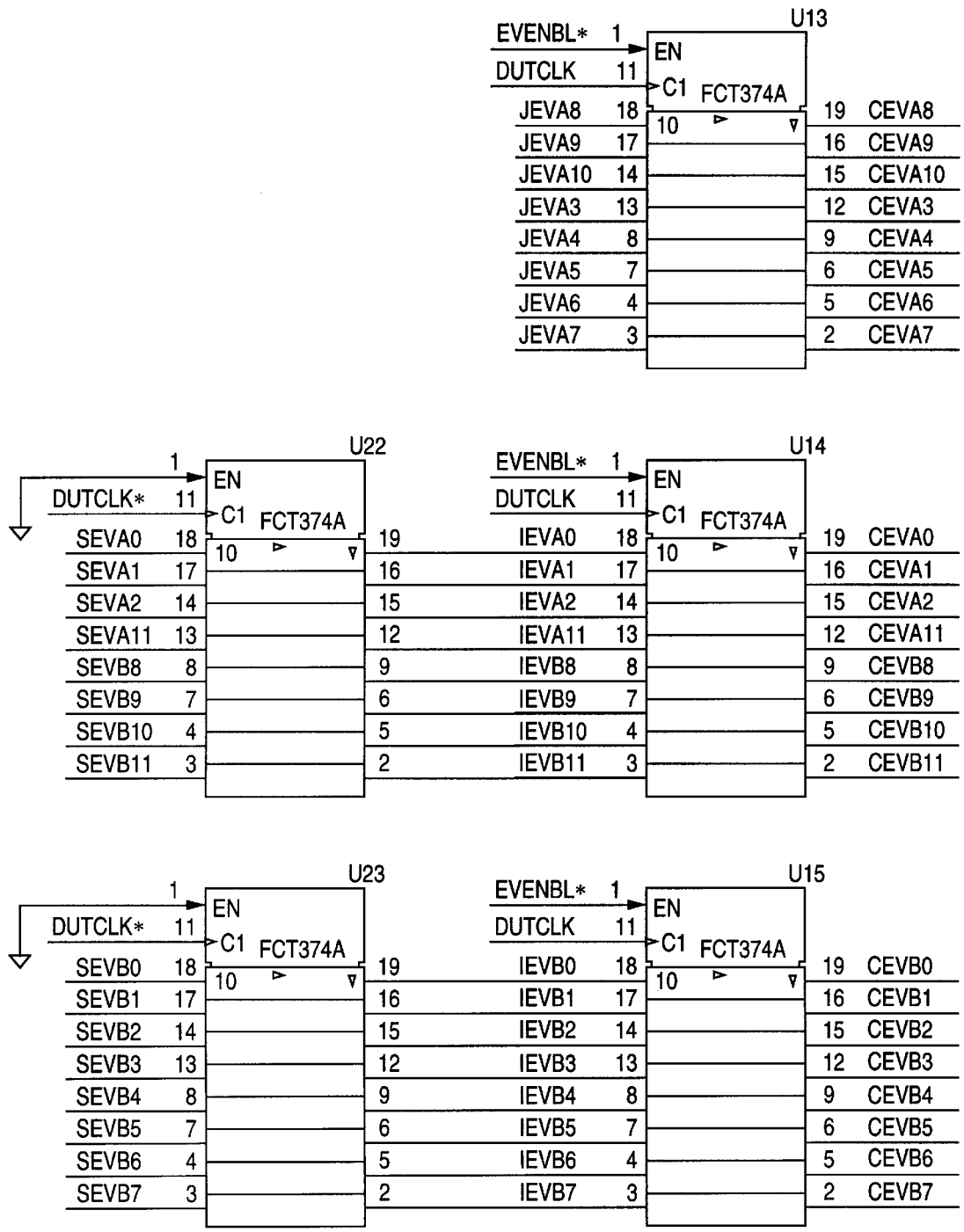
FIG. 16 is a schematic diagram of the logic used to sample the final event stream at the higher clock rate.

FIG. 16 is a schematic diagram of the logic used to sample the final event stream at the higher clock rate. After merging, the events are sampled at the high speed master clock rate to ensure the best possible clock to output delay. This also helps in minimizing noise and groundbounce feedback to the PLD (because the events are connected to other boards and systems).

Figure 17B:
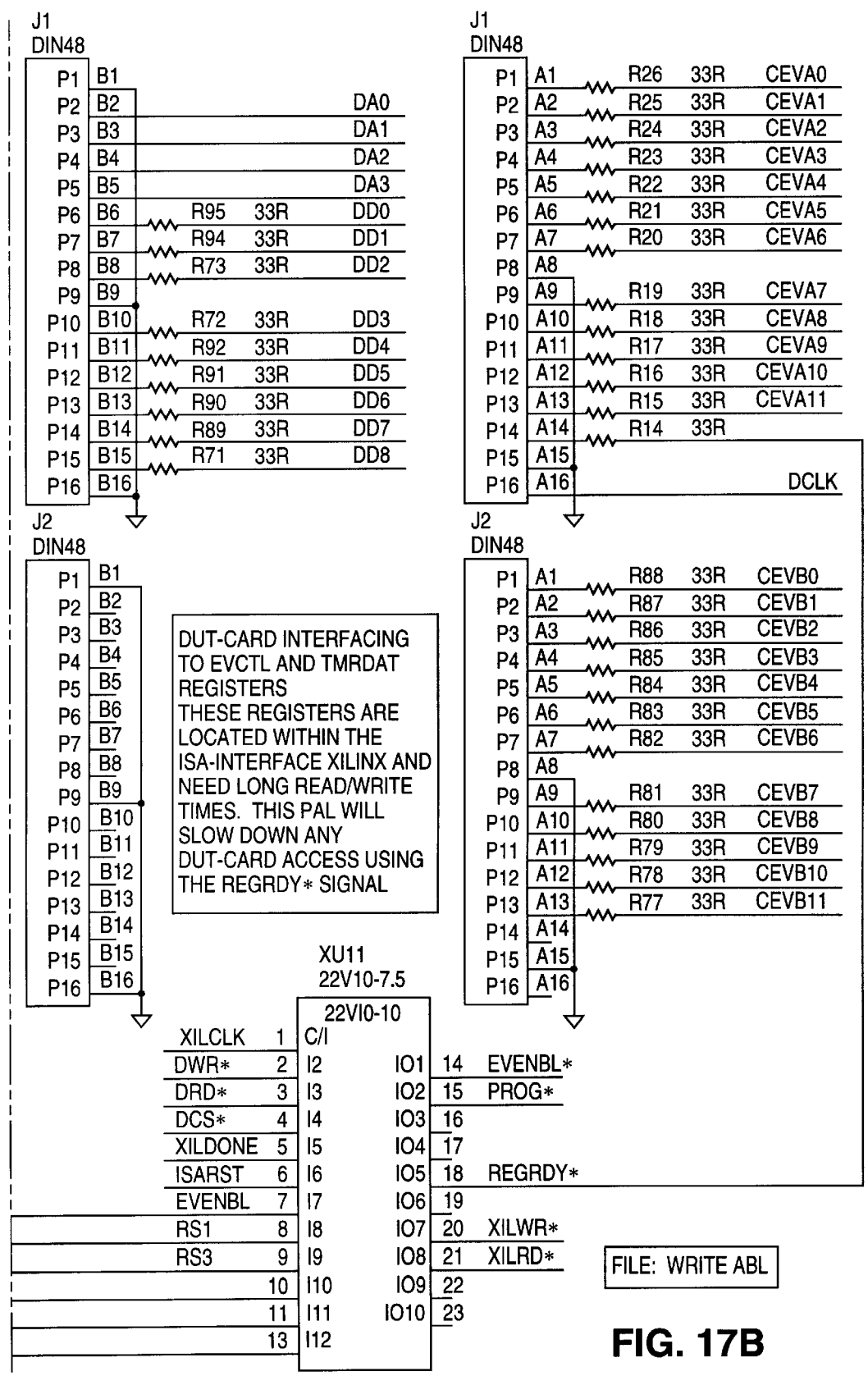
FIG. 17 is a schematic diagram showing the headers to the device-under-test (DUT).

FIG. 17 is a schematic diagram showing the headers to the device-under-test (DUT).

Figure 18A:
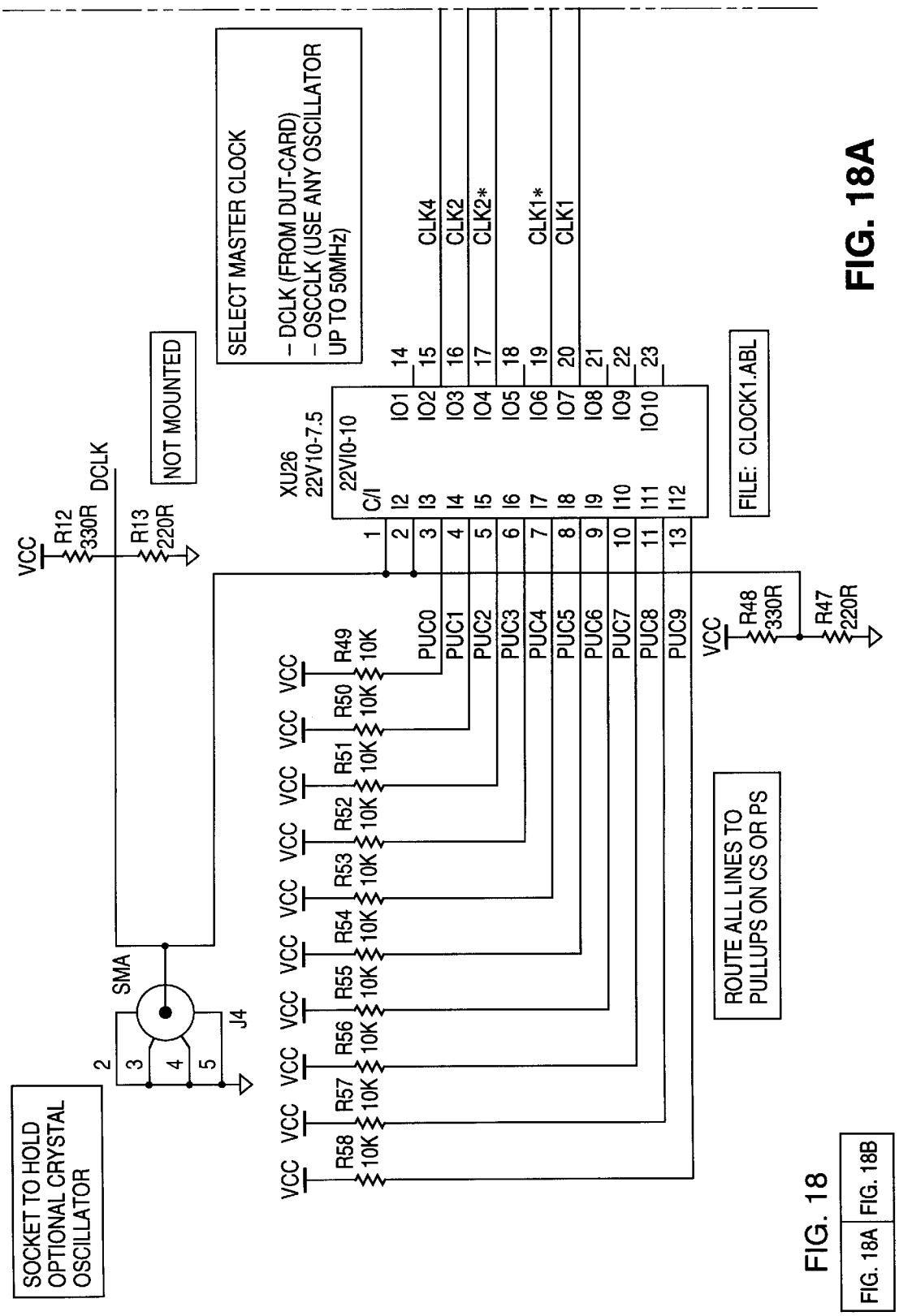
FIG. 18 is a schematic diagram of the clock generation and distribution elements of the present invention.
Figure 18B:
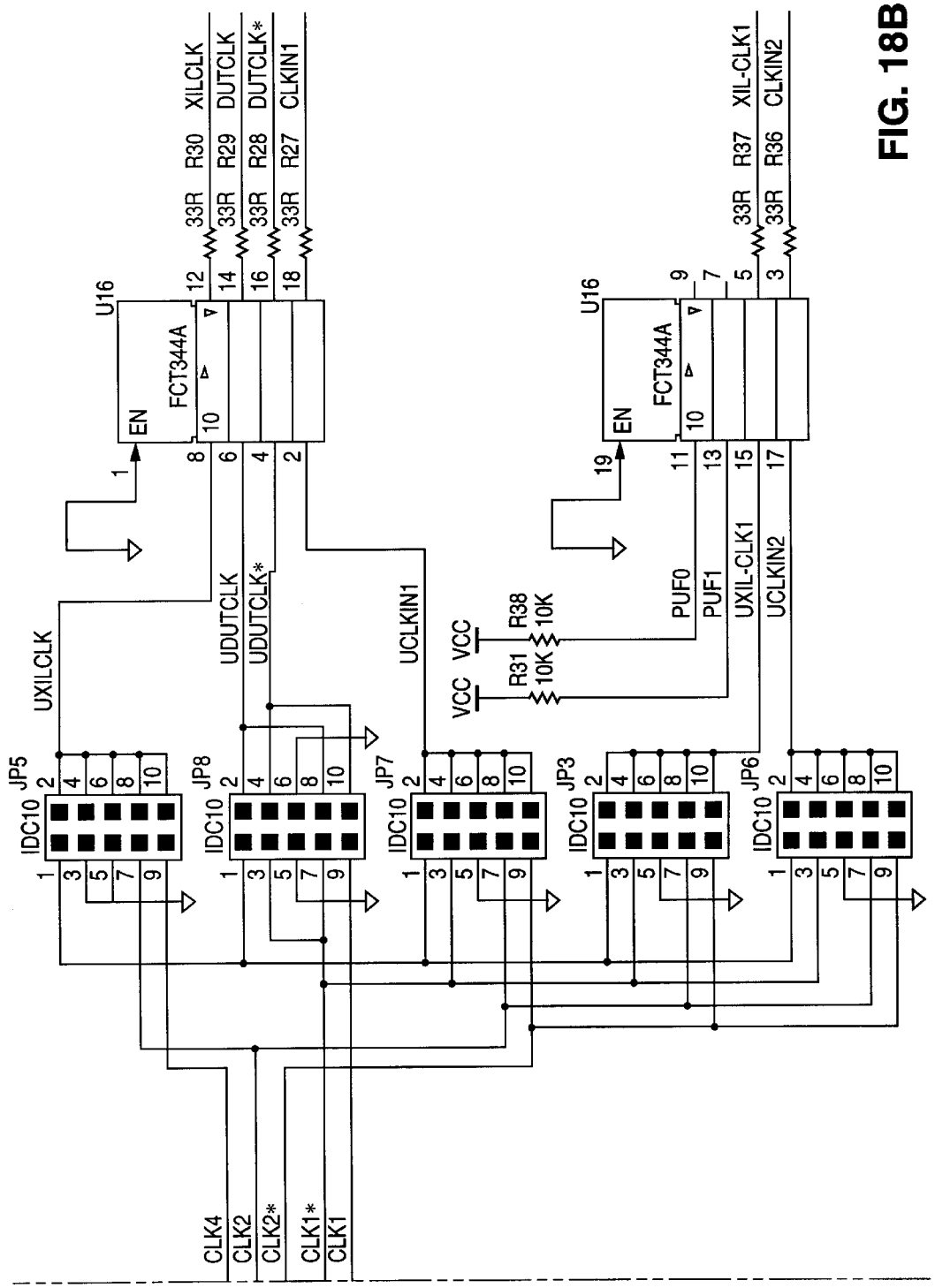

FIG. 18 is a schematic diagram of the clock generation and distribution elements of the present invention. As shown, all of the clock signals are generated from a main or master clock input. The figure shows the logic and the distribution options.

Figure 19A:
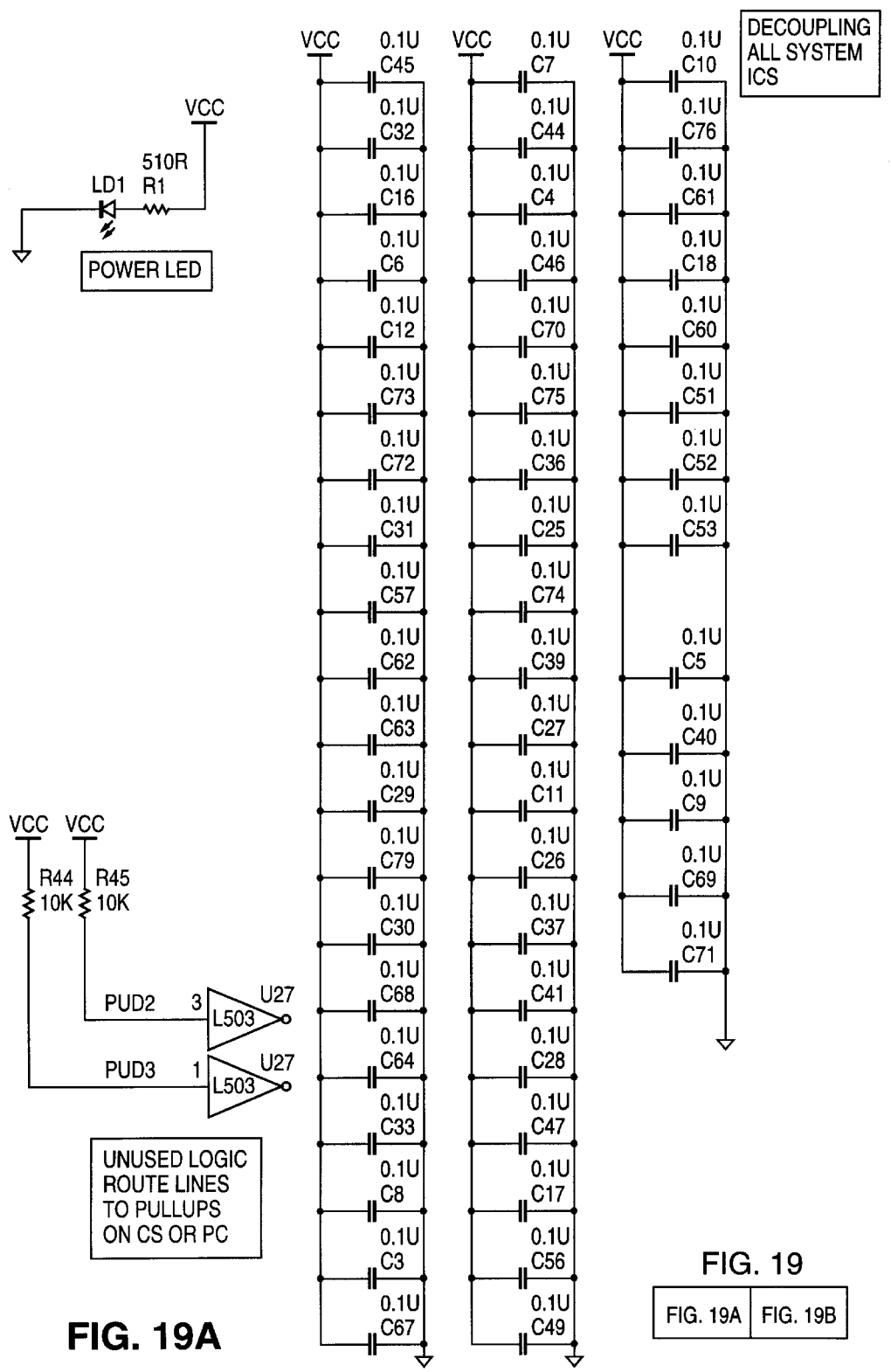
FIG. 19 is a schematic diagram of the decoupling capacitors used in the present invention.
Figure 19B:
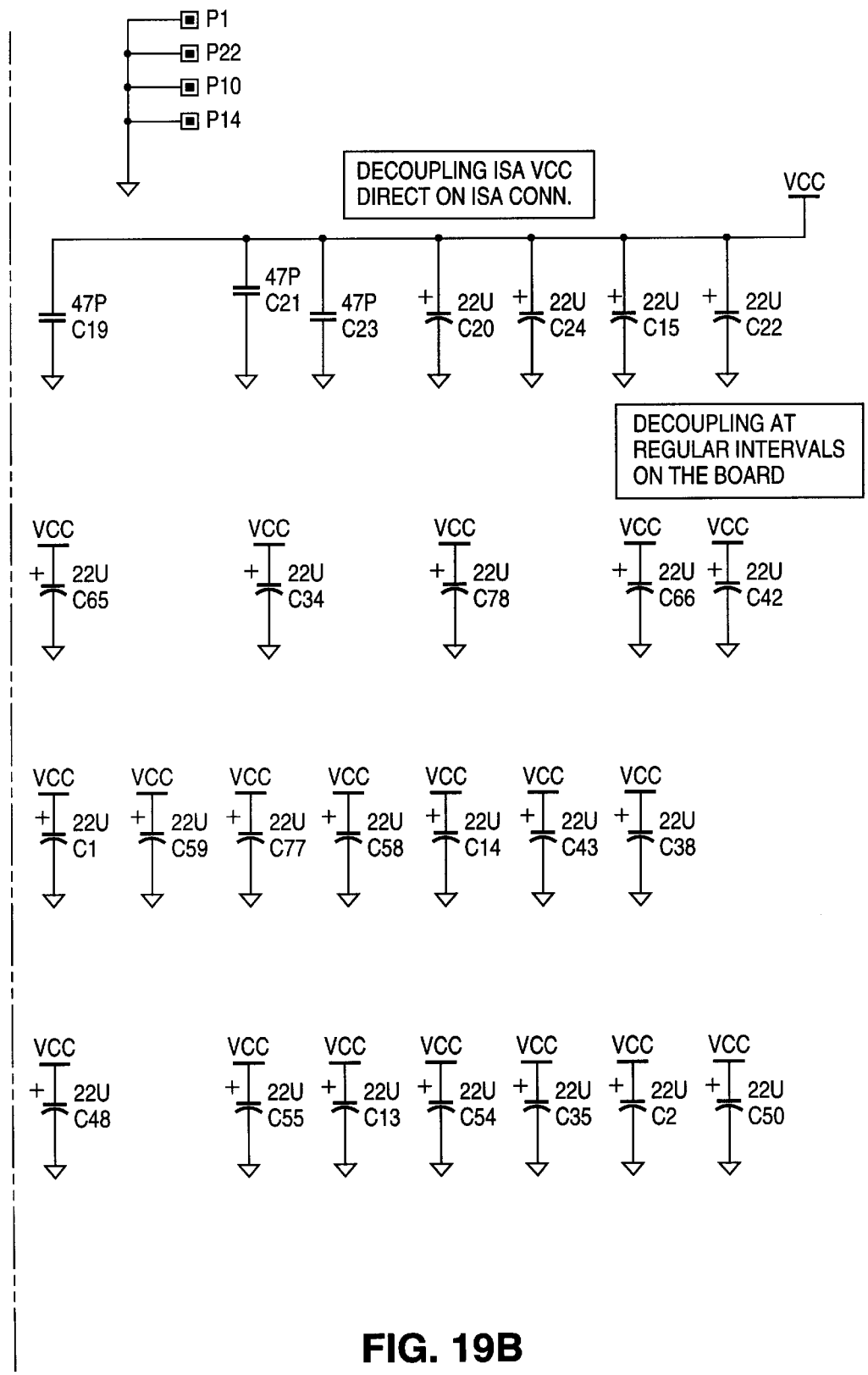

FIG. 19 is a schematic diagram of the decoupling capacitors used in the present invention. A decoupling capacitor is placed on every Vcc pin on the board to provide decoupling between Vcc and ground.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

APPENDIX

```
Current Implementation in PLD
module XOREV
title 'random xor/and/or etcc of events, rev A'
xorev    device    'P22V10';
"Clock inputs
"------------------------------
DUTCLK              pin 1;        "DUT CLock ie main clock (up to 50 MHz)
"Inputs
```

APPENDIX-continued

```
"----------------------------
SEVA3,SEVA4,SEVA5,SEVA6    pin 2,3,4,5;
SEVB3,SEVB4,SEVB5,SEVB6    pin 6,7,8,9;
nEN3,nEN4,nEN5,nEN6        pin 19,20,21,22;
RT0,RT1,RT2,RT3            pin 10,11,13,23;
"Outputs
"------------------
EV03,EV04,EV05,EV06        pin 15,16,17,18;
"Internal nodes
"---------------------
"Definitions /data Combining
"----------------------------
H,L,X,x =          1, 0 , .X., .X.;
SELECT3 =          [RT0,RT1,RT2];
SELECT4 =          [RT0,RT1,RT2];
SELECT5 =          [RT0,RT1,RT2];
SELECT6 =          [RT0,RT1,RT2];
XORSEL =           [0,0,0];
ANDSEL =           [0,0,1];
ORSEL =            [0,1,0];
XNORSEL =          [0,1,1];
NANDSEL =          [1,0,0];
NORSEL =           [1,0,1];
EVASEL =           [1,1,0];
EVBSEL =           [1,1,1];
"=========================================
"========= DESCRIPTION OF DESIGN ==========
"=========================================
"
"The REG-card RTPG and event blocks only go up to 25 Mhz. If you wish to have events
"generated up to 50 Mhz, this pal may be used to generate 1 50 Mhz event out of two
"25 Mhz events (each clocked with 25 Mhz, but one inverted with respect to the other).
"
"one of 8 functions is chosen: XOR,AND,OR,XNOS,NAND,NOR,EVA,EVB, based on the SELECT
"inputs bits (3-bits, the fourth is not used).
"
"The selection of which RTPG bit selects was done at random.
"This pal can generate up to 4 50 MHZ events from 8 25 MHz input events.
"
"
"DUTCLK    |--| |--| |--| |--| |--| |--| |--| |--| |--| |--| |--| |--| |--| |--|
"              |--| |--| |--| |--| |--| |--| |--| |--| |--| |--| |--| |--| |--| |--|
"EVENTA    |----|       |----|       |----|       |----|       |----|       |----|       |----|
"CLOCK          |----|       |----|       |----|       |----|       |----|       |----|       |---
"EVENTB    |----|       |----|       |----|       |----|       |----|       |----|       |----|
"CLOCK          |----|       |----|       |----|       |----|       |----|       |----|       |---
"EVENTA    |    A1    |    A2    |    A3    |    A4    |    A5    |    A6    |    A7
"(<25 MHz) |----------|----------|----------|----------|----------|---------
"
"EVENTB         |    B1    |    B2    |    B3    |    B4    |    B5    |    B6    |
"(<25 MHz) |----|----------|----------|----------|----------|----------|----|----------|
"
"EVO       |    |    |A1 B1|A2 B1|A2 B2|A3 B2|A3 B3|A4 B3|A4 B4|A5 B4|A5 B5|A6 B5|A6 B6|
"(<50 MHz) |----|----|----|----|----|----|----|----|----|----|----|----|----
"
"Actual function depends on SELECT bits
"
"=========================================
"----------------------------------------
"************ Start of Equations ************
"----------------------------------------
equations
EV03.clk       =       DUTCLK;
EV04.clk       =       DUTCLK;
EV05.clk       =       DUTCLK;
EV06.clk       =       DUTCLK;
EV03           :=      (!nEN3 & (                                       "must be enabled
                       (SELECT3 == XORSEL)  & (SEVA3 $ SEVB3) #         "A XOR B
                       (SELECT3 == ANDSEL)  & (SEVA3 & SEVB3) #         "A AND B
                       (SELECT3 == ORSEL)   & (SEVA3 # SEVB3) #         "A OR B
                       (SELECT3 == XNORSEL) & !(SEVA3 $ SEVB3) #        "A XNOR B
                       (SELECT3 == NANDSEL) & !(SEVA3 & SEVE3) #        "A NAND B
                       (SELECT3 == NORSEL)  & !(SEVA3 # SEVB3) #        "A NOR B
                       (SELECT3 == EVASEL)  & (SEVA3) #                 "Select EVENT A
                       (SELECT3 == EVBSEL)  & (SEVB3)) #                "Select EVENT B
                       (nEN3 & SEVA3));                                 "not enabled --> select Event A
EV04           :=      (!nEN4 &
                       (SELECT4 == XORSEL)  & (SEVA4 $ SEVB4) #
                       (SELECT4 == ANDSEL)  & (SEVA4 & SEVB4) #
```

APPENDIX-continued

```
                          (SELECT4 == ORSEL) & (SEVA4 # SEVB4) #
                          (SELECT4 == XNORSEL) & !(SEVA4 $ SEVB4) #
                          (SELECT4 == NANDSEL) & !(SEVA4 & SEVB4) #
                          (SELECT4 == NORSEL) & !(SEVA4 # SEVB4) #
                          (SELECT4 == EVASEL) & (SEVA4) #
                          (SELECT4 == EVBSEL) & (SEVB4)) #
                          (nEN4 & SEVA4));
EV05            :=        (!nEN5 & (
                          (SELECT5 == KORSEL) & (SEVAS $ SEVB5) #
                          (SELECT5 == ANDSEL) & (SEVA5 & SEVB5) #
                          (SELECT5 == ORSEL) & (SEVA5 # SEVB5) #
                          (SELECT5 == XNORSEL) & !(SEVA5 $ SEVB5) #
                          (SELECT5 == NANDSEL) & !(SEVA5 & SEVB5) #
                          (SELECT5 == NORSEL) & !(SEVA5 # SEVB5) #
                          (SELECT5 == EVASEL) & (SEVA5) #
                          (SELECT5 == EVBSEL) & (SEVB5)) #
                          (nEN5 & SEVA5));
EV06            :=        (!nEN6 &
                          (SELECT6 == XORSEL) & (SEVA6 $ SEVB6) #
                          (SELECT6 == ANDSEL) & (SEVA6 & SEVB6) #
                          (SELECT6 == ORSEL) & (SEVA6 # SEVB6) #
                          (SELECT6 == XNORSEL) & !(SEVA6 $ SEVB6) #
                          (SELECT6 == NANDSEL) & !(SEVA6 & SEVB6) #
                          (SELECT6 == NORSEL) & !(SEVA6 # SEVB6) #
                          (SELECT6 == EVASEL) & (SEVA6) #
                          (SELECT6 == EVBSEL) & (SEVB6)) #
                          (nEN6 & SEVA6));
end XOREV
```

I claim:

1. An apparatus for generating a stream of test events, comprising:

a first event generating circuit responsive to a first clock signal having a first clock frequency by producing a first stream of random test events at the first clock frequency;

a second event generating circuit responsive to a second clock signal having a second clock frequency by producing a second stream of random test events at the second clock frequency;

an event merging circuit responsive to the first and second streams of random test events by producing a third stream of random test events at a third clock frequency which is greater than the first clock frequency and greater than the second clock frequency; and a clock signal generating circuit which produces the first, second, and third clock signals.

2. The apparatus for generating a stream of test events of claim 1, wherein the first clock frequency is equal to the second clock frequency, and the third clock frequency is equal to the sum of the first and second clock frequencies.

3. The apparatus for generating a stream of test events of claim 1, wherein the event merging circuit further comprises:

a logical operation circuit which merges the first and second streams of random test events by performing a logical operation on an event from the first stream of random test events and an event from the second stream of random test events.

4. The apparatus for generating a stream of test events of claim 3, wherein the logical operation performed by the logical operation circuit is selected from the group consisting of (OR, AND, NAND, NOR, XOR, and XNOR).

5. The apparatus for generating a stream of test events of claim 1, further comprising:

an event stream sampling circuit which samples the first and second streams of random test events.

6. The apparatus for generating a stream of test events of claim 1, wherein the first and second event generating circuits further comprise:

an event shaping circuit responsive to a control signal to produce one of a plurality of events as an output of the first and second event generating circuits.

7. A method of generating a stream of random test events, comprising:

generating a first stream of random test events at a first rate;

generating a second stream of random test events at a second rate;

merging the first and second streams of random test events to produce a merged stream of random test events; and sampling the merged stream of random test events at a third rate, wherein the third rate is greater than the first rate and greater than the second rate.

8. The method of generating a stream of random test events of claim 7, wherein the step of merging the first and second streams of random test events further comprises:

performing a logical operation on an event from the first stream of random test events and an event from the second stream of random test events.

9. The method of generating a stream of random test events of claim 8, wherein the logical operation is selected from the group consisting of (OR, AND, NAND, NOR, XOR, and XNOR).

10. The method of generating a stream of random test events of claim 7, wherein the first rate is equal to the second rate, and the third rate is equal to the sum of the first and second rates.

* * * * *